(12) United States Patent
Vary et al.

(10) Patent No.: US 8,364,476 B2
(45) Date of Patent: Jan. 29, 2013

(54) METHOD AND APPARATUS OF COMMUNICATION

(75) Inventors: Peter Vary, Aachen (DE); Hauke Kruger, Aachen (DE); Bernd Geiser, Aachen (DE)

(73) Assignee: Huawei Technologies Co., Ltd., Shenzhen (CN)

( * ) Notice: Subject to any disclaimer, the term of this patent is extended or adjusted under 35 U.S.C. 154(b) by 17 days.

(21) Appl. No.: 12/905,852

(22) Filed: Oct. 15, 2010

(65) Prior Publication Data

US 2011/0137645 A1    Jun. 9, 2011

Related U.S. Application Data

(63) Continuation of application No. PCT/CN2008/070719, filed on Apr. 16, 2008.

(51) Int. Cl.
*G10L 19/00*    (2006.01)

(52) U.S. Cl. ............. 704/222; 704/200; 704/200.1; 704/201; 704/221

(58) Field of Classification Search .......... 704/200–201, 704/221, 222
See application file for complete search history.

(56) References Cited

U.S. PATENT DOCUMENTS

| | | | |
|---|---|---|---|
| 6,148,283 A * | 11/2000 | Das | 704/222 |
| 6,363,338 B1 * | 3/2002 | Ubale et al. | 704/200.1 |
| 7,272,566 B2 * | 9/2007 | Vinton | 704/500 |
| 7,680,670 B2 * | 3/2010 | Lamblin et al. | 704/500 |
| 7,966,175 B2 * | 6/2011 | Xie | 704/229 |
| 2004/0176951 A1 * | 9/2004 | Sung et al. | 704/222 |
| 2008/0097749 A1 * | 4/2008 | Xie et al. | 704/200.1 |
| 2008/0097755 A1 * | 4/2008 | Xie | 704/222 |
| 2009/0192790 A1 * | 7/2009 | El-Maleh et al. | 704/219 |
| 2010/0174531 A1 * | 7/2010 | Bernard Vos | 704/201 |

FOREIGN PATENT DOCUMENTS

| | | |
|---|---|---|
| CN | 1878313 A | 12/2006 |
| WO | WO 98/18262 | 4/1998 |
| WO | WO 03/103151 A1 | 12/2003 |
| WO | WO 2007/035148 A2 | 3/2007 |
| WO | WO 2007/083264 A1 | 7/2007 |
| WO | WO 2009/127097 A1 | 10/2009 |

OTHER PUBLICATIONS

Extended European Search Report issued in corresponding European Patent Application No. 08734077.4, mailed Mar. 7, 2011.

(Continued)

*Primary Examiner* — Douglas Godbold

(74) *Attorney, Agent, or Firm* — Brinks Hofer Gilson & Lione

(57) ABSTRACT

The invention pertains to a method and apparatus of efficient encoding and decoding of vector quantized data. The method and system explores and implements sub-division of a quantization vector space comprising class-leader vectors and representation of the class-leader vectors by a set of class-leader root-vectors facilitating faster encoding and decoding, and reduced storage requirements.

12 Claims, 15 Drawing Sheets

OTHER PUBLICATIONS

Written Opinion of the International Searching Authority issued in corresponding PCT Patent Application No. PCT/CN2008/070719, mailed Jan. 22, 2009.

Adoul et al., "Baseband Speech Coding at 2400 BPS Using Spherical Vector Quantization", International Conference on Acoustics, Speech 7 Signal Processing. ICASSP. San Diego, Mar. 19-21, 1984.

Adoul et al., "Nearest Neighbor Algorithm for Spherical Codes from the Leech Lattice", IEEE Transactions on Information Theory, IEEE. US. vol. 34, No. 5, Sep. 1, 1988.

Lamblin et al., Algorithme de Quantification Vectorielle Spherique a Partir Du Reseau de Gosset D'ordre 8, Annales Des Telecommunications, Les Moulineaux, France. vol. 73, No. 3/04. Mar. 1, 1988.

Office Action issued in corresponding European Patent Application No. 08734077.4, mailed Apr. 3, 2012.

Office Action issued in corresponding Chinese Patent Application No. 200880128702.0, mailed Nov. 14, 2012.

* cited by examiner

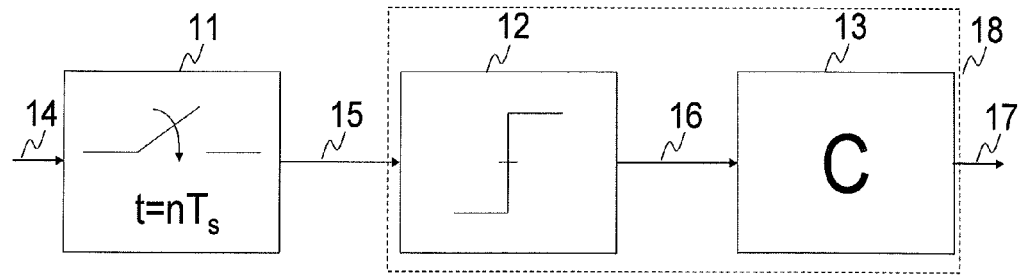
Fig. 1 <Prior Art>
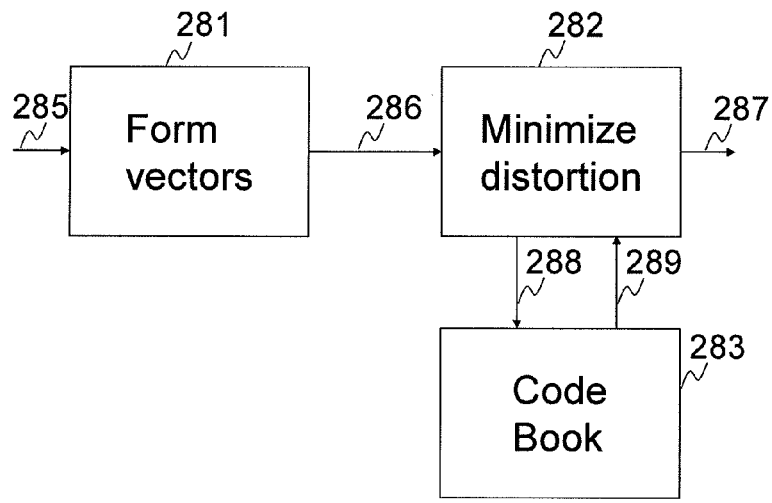
Fig. 2 <Prior Art>
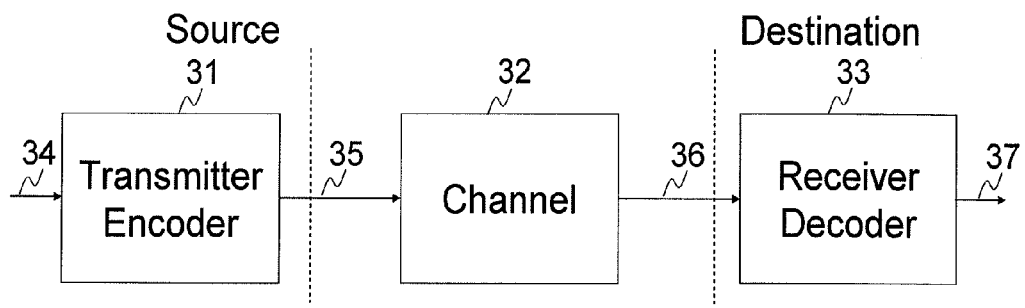
Fig. 3 <Prior Art>

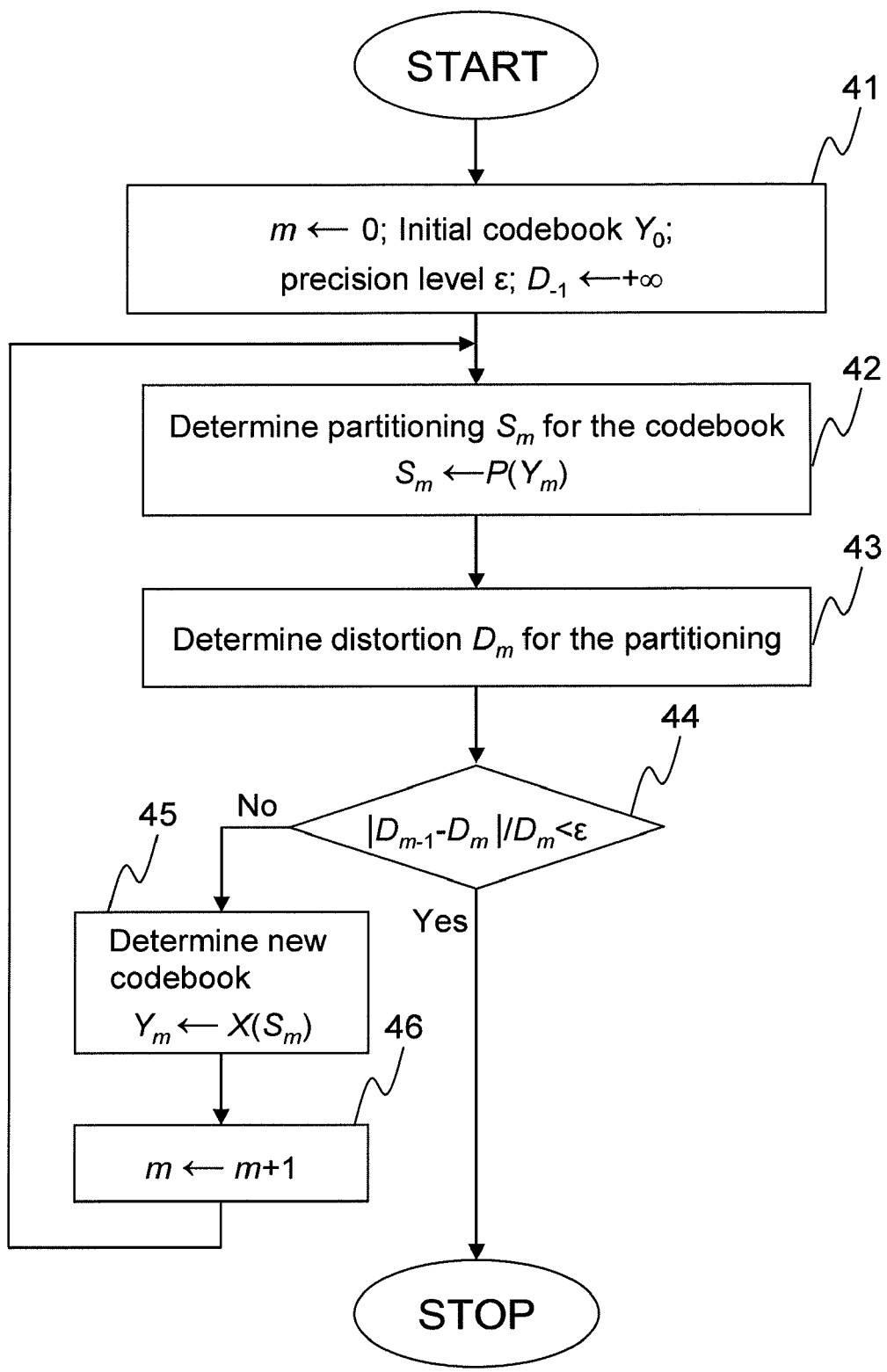
Fig. 4 <Prior Art>

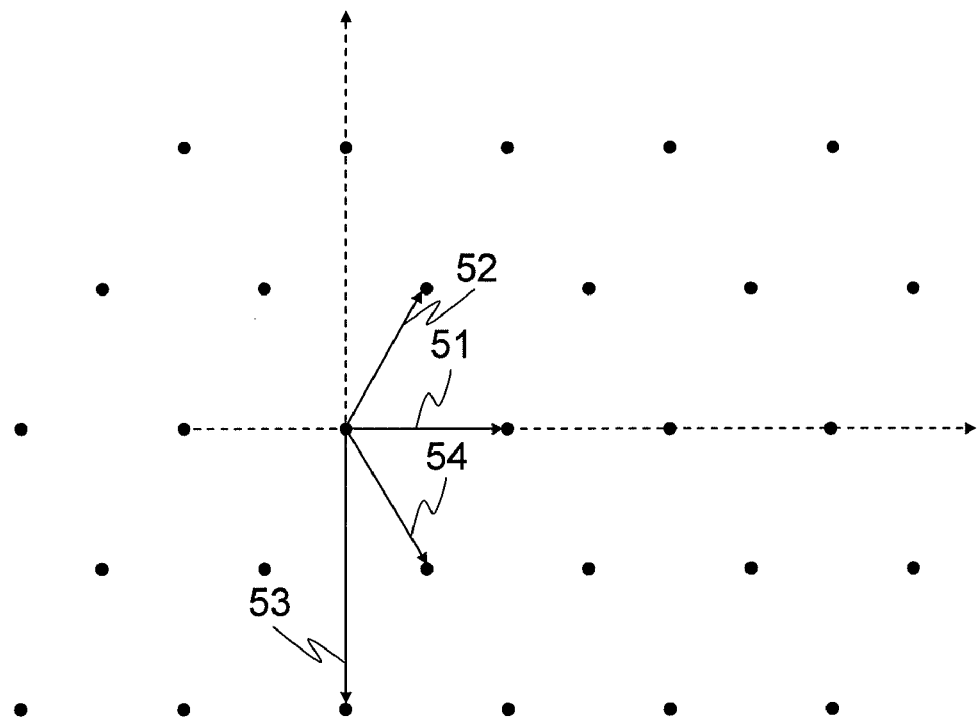
Fig. 5 <Prior Art>
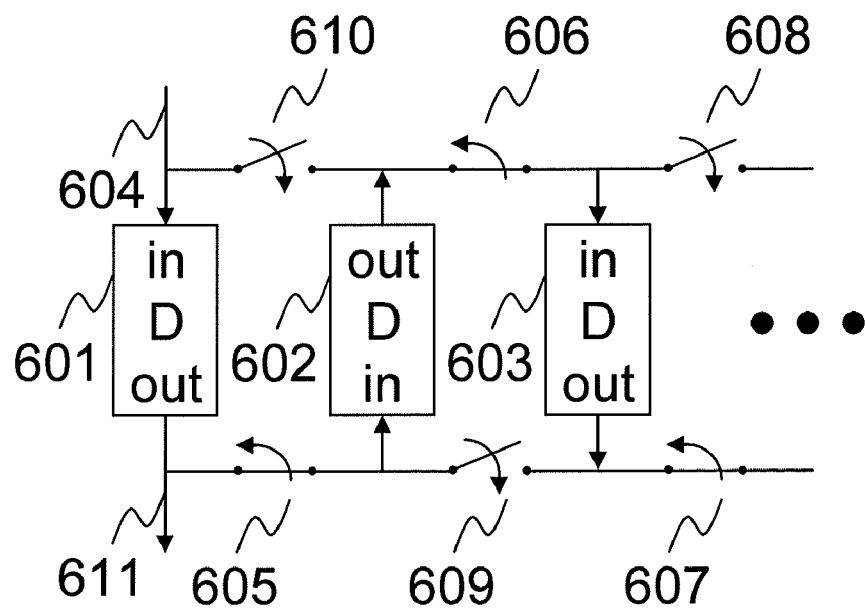
Fig. 6 <Prior Art>

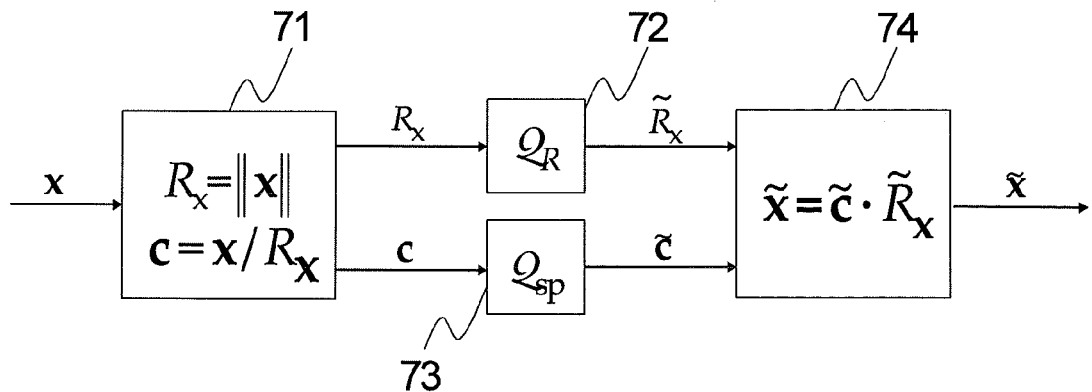
Fig. 7 <Prior Art>
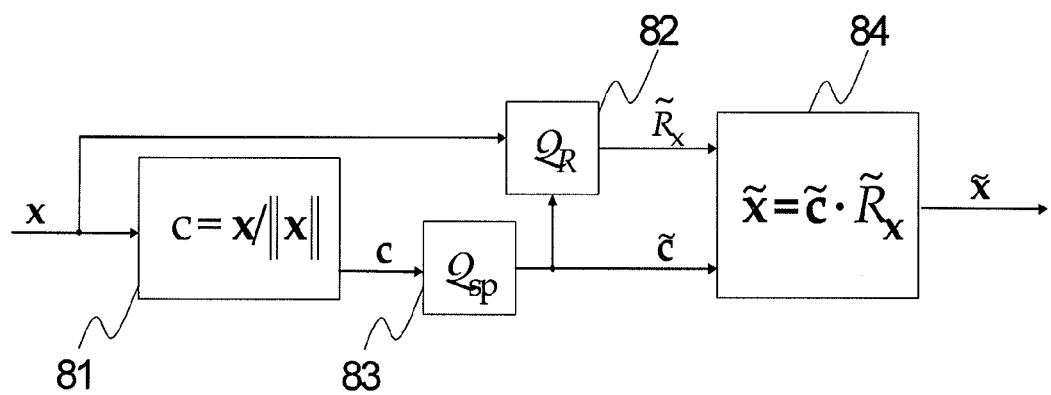
Fig. 8

METHOD AND APPARATUS OF COMMUNICATION

CROSS-REFERENCE TO RELATED APPLICATION

This application is a continuation of International Application No. PCT/CN2008/070719, filed on Apr. 16, 2008, which is hereby incorporated by reference in its entirety.

TECHNICAL FIELD

The technical field includes communications and signal processing. More particularly, the invention relates to a method and apparatus providing data processing of low complexity for spherical vector quantization, SVQ.

BACKGROUND

Today's communications are to a great extent digital. They are both time discrete and discrete in amplitude, relying upon digital samples. Well-known examples of the technical development from analogue communications systems to digital communications systems are digitization for distribution of analogue telephony and the switch from vinyl records to audio compact discs, audio CDs in the 70's and 80's. Other examples have followed, such as portable digital audio players and digital television broadcasting.

For fixed analogue telephony, analogue speech is distributed in electrical signals over phone wires. When analogue telephone systems have been digitized, the speech is still carried in analogue electrical signals from the phone to a switch of the operator, where it is digitized so as to allow reconstruction within predefined requirements or criteria as regards distortion of the analogue signal. To provide required dynamics with a limited number of bits, the speech signal is compressed before the digitization providing a digital signal for distribution. The compressors provide signals of reduced dynamics but are essentially lossless, since the analogue signal could be expanded in a receiver. This compression is known as A-law or µ-law compression. At the receiving end, the signal is then expanded. Today there are also fixed telephone systems being digital all the way from one phone to another. In this description, compression is used for referring to lossy or lossless compression.

As regards CDs, analogue samples of time-continuous sound are quantized into a fixed number of bits (16 bits) with no compression of the quantized data. The limitation of sound samples to fixed levels provides some difference between the digitized samples and the analogue samples. This is known as quantization noise or distortion. Since the number of quantization levels is great ($2^{16}$), the distortion is negligible compared to the noise produced in analogue components of most audio CD players or amplifiers and loudspeakers.

As regards portable audio players and video broadcasting, the requirement on reducing the number of bits required for storage or transmission while not requiring too complex equipment requiring a huge amount of storage or power for feeding extremely fast (and power consuming) computers. Today, portable digital audio players and set top boxes for TV reception are available to many of those households that want them due to achievements of the technical development as regards, e.g., coding, storage media, such as flash memories, and computational capacity. Digital content stored on most portable digital audio players or broadcast in digital television or sound radio systems is compressed by lossy compression.

A communications channel may include media such as electromagnetic storage, electronic memories, propagation of signals in traveling waves of electromagnetic fields from a transmitting antenna to a receiving antenna, or propagation of optical signals from an optical transmitter to a receiver for optical signals.

Telephone systems, CDs, digital portable audio players and television broadcasting all provide examples of communications over a communications channel. The fixed wire provides a communications channel for the telephone system, the CD for the distribution of audio from a studio to a listener via a CD player, the flash memory or other storage medium for the portable audio player or the radio channel for television broadcasting.

R. M. Gray and D. L. Neuhoff, "Quantization," IEEE Transactions on Information Theory, 1998, vol. 44, no. 6, pp. 2325-2383, traces the history of quantization from its origins, starting from 1898, and survey the fundamentals of many of the popular and promising techniques for quantization.

Gray and Neuhoff refer quantization to "the division of a quantity into a discrete number of small parts." As an example, any real number can be rounded off to the nearest integer. In binary computing, integers are commonly represented by sequences of binary digits, bits, thereby providing a binary representation of the quantized real number. Other example data representations exist as well.

Quantization and source coding have their origins in pulse code modulation, PCM, the system used for audio CD recording. A PCM system consists fundamentally of three components: a sampler (11), a quantizer (12) and an encoder (13) as schematically illustrated in FIG. 1. Sampling converts a continuous time waveform (14) into a discrete time waveform (14). Quantization (12) of the samples (15) renders the quantized samples (16) to be approximations of the unquantized samples (15). The quantized samples, or indices thereof, are transmitted on a communications channel (17) as provided by the encoder (13). With scalar quantization, SQ, each (quantized) sample is independently encoded into a fixed number of bits, and correspondingly decoded into a reproduction. For a given distortion or reconstruction error, scalar quantization generally requires comparatively greater data rates than vector quantization, VQ.

Vector quantization, VQ, quantizes a number of samples simultaneously. VQ provides significantly higher quantization performance than scalar quantization, SQ, in the case of a fixed bit rate. In case of k successive samples to be quantized, VQ, makes use of a k-dimensional partition or a k-dimensional codebook, C, comprising k-dimensional code vectors, each code vector representing a cell of vectors with minimum distortion according to a predefined criterion, such as minimum Euclidean distance. For this purpose it is convenient to consider the quantization and encoding to be tightly related or one concept as schematically indicated by a dashed line (18) in FIG. 1. An advantage of VQ as compared to SQ is that it inherently can exploit memory of source signals to be quantized, source signals such as the discrete time sequence (14) of the sampled waveform. Thereby, source signals such as speech signals or image signals commonly comprising memory or dependencies between different samples can be represented more efficiently. Also VQ comprises merits on its own and, in principle, SQ cannot perform better in terms of distortion versus rate than the best VQ. In prior art, the price for this improvement has been paid by increased complexity of, particularly, the encoder.

FIG. 2 illustrates a simplified block diagram for vector quantization. A signal sequence (285) is represented by vectors (281) and signals (286) carrying the vectors are mapped (282) into an index (287) corresponding to a representation or codeword of the codebook, a code vector, providing a minimum distortion encoding of the vectors (286) according to a predefined criterion or measure, e.g. Euclidean distance. The vector to be represented (288) and the quantized vector or a representative thereof (289) are exchanged between the minimum distortion determining entity (282) and the entity comprising the code book representation (283). At the output of the channel (at a receiving end) the reconstructed vector is achieved by using a similar codebook and looking up the code vector represented by the received index.

Essentially, transmission on a communications channel comprises all technical arrangements for distributing or communicating a signal from a source sender to a destination as schematically illustrated in FIG. 3. A sequence representing a code index (34, 35) is transmitted through a communications channel (32) to the destination where it is decoded in the receiver (33). From the viewpoint of a source encoder and decoder, the channel may be considered to comprise channel coding as need be to transmit or detect errors on a transmission channel. In practice, though, channel encoders and decoders separated from the source encoding and decoding are included in physical transmitters and receivers, respectively. So, from the viewpoint of the source encoding, also parts of physical transmitters and receivers are frequently included in the communications channel (32).

For low bit rates, a good way to design a vector quantizer, from a rate distortion perspective, is to adapt the quantizer to characteristics of a given input source, e.g. provided in training sequences. FIG. 4 illustrates schematically a flowchart for iteratively determining a codebook Y according to a generalized Lloyd algorithm, frequently referred to as an LBG algorithm (as disclosed by Y. Linde A. Buzo and R. Gray). The algorithm is initiated (41) by initializing a counter m, an initial codebook $Y_0$, a maximum possible (within the applicable range of the application) distortion $D_{-1}$ and a precision level $\epsilon$. For each iteration, m, a partitioning $S_m$ defining the cells surrounding the various code vectors of the code book, is determined (42) for the code book $Y_m$, and the distortion $D_m$ is determined (43). The algorithm is interrupted (44) when the relative distortion is smaller than the precision set initially. In case the relative distortion is greater than the preset level, $\epsilon$, a refined codebook is determined, the iteration counter is updated (46) and the process repeats for another iteration starting with determining a partitioning for the refined codebook (42).

The LBG algorithm is commonly considered to be computational expensive in terms of number of instructions when there is a great number of quantization levels. It is also sensitive to the initial choice of codebook (41). Also the amount of read-only memory, ROM, required by a trained vector quantizer is usually considered to be too large. Another problem is related to the LBG algorithm being trained to provide minimum distortion for a particular training data sequence. If data from another source with substantially different statistical properties is quantized, the performance is most often suboptimal. For vectors of dimension 1, the LBG quantizer reduces to the scalar Lloyd-Max quantizer.

For high bit rates, the theory of VQ provides a method for creating a codebook providing the smallest distortion, e.g. in terms of Euclidean distance or squared Euclidean distance, given a certain statistic of the input signal based on the calculation of a point density function from the probability density function, PDF, of the input signal. Structured codebooks do not exploit linear or non-linear dependency to increase the quantization performance that vector quantizers are generally capable of. At least linear dependencies, however, can be transformed to provide a benefit in quantization performance by means of Linear Prediction or Transform Coding. Therefore, the structured vector quantizers are designed such that they have high performance for memoryless sources.

A lattice vector quantizer is a vector quantizer of which the codebook is composed of vectors which are arranged in a regular lattice according to a mathematical rule. A degenerate example lattice quantizer is a uniform scalar quantizer for the special case of a vector quantizer of dimension $L_v=1$. Lattices in higher dimensions benefit from a more efficient space filling. In other words, a lattice, $\Lambda$, comprises all vectors in an $L_v$ dimensional vector space with $$L: y \in \left\{ \sum_{j=0}^{L_L-1} \lambda_j \cdot v_j : \lambda_j \in \mathbb{Z}, \ v_j \in \mathbb{R}^{L_v} \right\}. \quad \text{eq. 1}$$

where $\mathbb{Z}$ denotes integers, and $\mathbb{R}^{L_v}$ denotes real $L_v$-tuples. The vectors $v=[v_{i,0}, v_{i,1}, \ldots, v_{i,L_v-1}]$ are the basis vectors of the lattice, and all lattice vectors are linear combinations of these basis vectors. The factors $\lambda_j$ to weight each basis vector are integer numbers. A lattice in general is a subset of an $L_v$-dimensional vector space but consists of a countable infinite number of points, $$L \subset \mathbb{R}^{L_v} \quad \text{eq. 2}$$

The number, L, of weighting factors $\lambda_i$ determines the lattice's degree of freedom and is also called the dimension of the lattice. L can be greater or smaller than $L_v$. In most cases, the dimension equals the dimension of the vector space in which the basis vectors are defined, $L_L=L_v$.

For the case that the dimension of the lattice equals the dimension of the code-vector space, equation 1 is equivalent to a representation including a generator matrix M, $$L: y \in \{\lambda \cdot M : \lambda = [\lambda_0, \lambda_1, \ldots, \lambda_{L_v-1}], M = [v_0^T, v_1^T, \ldots, v_{L_v-1}^T]\}, \quad \text{eq. 3}$$

where the factors $\lambda_j$ as before are integer weight factors and $L_v$ is the dimension of the vector space. When more than one matrix provide the same distribution of points considering all $\lambda$ in equation 3, they are all generator matrices of one and the same lattice.

FIG. 5 illustrates an example two dimensional hexagonal lattice and corresponding basis vectors forming the generator matrix M. There are four vectors (51, 52, 53, 54) depicted. Vectors [1, 0] (51) and [½, √3/2] (52) span the same set of points as do basis vectors [0, -√3] (53) and [½, -√3/2] (54).

An example generator matrix providing the lattice is consequently $$M = \begin{bmatrix} 1 & 1/2 \\ 0 & \sqrt{3}/2 \end{bmatrix}. \quad \text{eq. 4}$$

Another example generator matrix of the lattice is $$M' = \begin{bmatrix} 0 & 0 \\ -\sqrt{3}/2 & -\sqrt{3} \end{bmatrix}. \quad \text{eq. 5}$$

An alternative, but equivalent, definition of the two dimensional hexagonal lattice, also referred to as the $A_2$ lattice, in FIG. 5 is $$A_2 : y \in \left\{ [y_0, y_1, \ldots, y_{L_v-1}] : y \in \mathbb{R}^{L_v}, \sum_{j=0}^{L_v-1} y_j = 0 \right\}. \qquad \text{eq. 6}$$

Jacques Martinet, "*Perfect Lattices in Euclidean Spaces,*" Springer-Verlag, Berlin, 2003, pp. 110-114, defines lattices of prior art such as the hexagonal lattice, $A_{L_v}$, and its dual, $A^*_{L_v}$, the checkerboard lattice, $D_{L_v}$, and its dual $D^*_{L_v}$, and the integer lattice, $Z_{L_v}$, for arbitrary dimensions $L_v$. In the sequel, the printing symbol asterisk will be used for other purposes than for denoting a dual lattice.

Other known lattices are the Gosset lattice, $E_8$, the Coxeter-Todd-Lattice, $K_{12}$, the Barnes-Wall lattice $L_{16}$, and the Leech Lattice $L_{24}$.

A permutation code P defines all vectors of a codebook by means of class-leader vectors, $\tilde{x}_P$, of dimension $L_v$. A class-leader vector $\tilde{x}_P$ is composed of coordinate entries $\tilde{x}_{P,j}$, $0 \leq j < L_v$, comprising $w_j$ components taken from a set of $L_P \leq L_v$ real values, $\mu_l$, $0 \leq l < L_P$, sorted in decreasing order, $\mu_0 > \mu_1 > \ldots > \mu_{L_P-1}$, $$\tilde{x}_P = [x_{P,0} \; x_{P,1} \; \ldots \; x_{P,L_v-1}]^T \qquad \text{eq. 7}$$

$$= \begin{bmatrix} \underbrace{\mu_0 \; \mu_0 \; \ldots \; \mu_0}_{w_0} \; \underbrace{\mu_1 \; \mu_1 \; \ldots \; \mu_1}_{w_1} \; \ldots \; \underbrace{\mu_{L_P-1} \; \mu_{L_P-1} \; \ldots \; \mu_{L_P-1}}_{w_{L_P-1}} \end{bmatrix}^T.$$

$w_l$ is the weight related to real value $\mu_l$ and is the number of occurrences of real value $\mu_l$, $0 \leq l < L_P$, $$\sum_{l=0}^{L_P-1} w_l = L_v. \qquad \text{eq. 8}$$

A permutation of a class-leader vector $\tilde{x}_P$ is a vector $\tilde{x}^*_P$ that is composed of the same real values, $\mu_l$, as $\tilde{x}_P$ but in a different order. The corresponding permutation operation can be specified by means of matrix, P, referred to as the permutation matrix. The relation between $\tilde{x}_P$ and $\tilde{x}^*_P$ could then be expressed as $$\tilde{x}^*_P = P \cdot \tilde{x}_P = [\tilde{x}^*_{P,0} \tilde{x}^*_{P,1} \ldots \tilde{x}^*_{P,L_v-1}]^T. \qquad \text{eq. 9}$$

An example permutation vector reversing the sequence order is $$P = \begin{bmatrix} 0 & \ldots & 0 & 0 & 1 \\ 0 & \ldots & 0 & 1 & 0 \\ \ldots & \ldots & \ldots & \ldots & \ldots \\ 0 & 1 & 0 & \ldots & 0 \\ 1 & 0 & 0 & \ldots & 0 \end{bmatrix}. \qquad \text{eq. 10}$$

The permutation processing is preferably realized in a digital signal processor, DSP, adapted for the permutation of interest. High speed applications may require the permutations to be implemented in hardware, which can be achieved by employment of e.g. shift register circuitry. Reversal of sequence order is e.g. achieved by storing the vector components in a shift register of the same length as the vector, in component-wise sequential order, and feeding out the shift register content in the reverse order. This is illustrated in FIG. 6. The example shift register is composed of a number of D latches (601-603). The vector to be reversed is input (604) to the shift register through closed switches (605-607) during a sequence of clock cycles during which one component of the vector is input after another. When the entire vector has been shifted into the D elements (601-603), the previously closed switches (605-607) are being opened, and switches (608-610), previously open while shifting the vector into the register, are being closed. During the next clock cycles, the components are shifted out of the shift register (611) in reverse order. Effectively, the shift register of FIG. 6 could be replaced by memory circuitry or a storage medium for storing controlled by a signal processor. The corresponding processing comprises storing the vector components in the memory or storage medium and reading out the memory content or stored content component wise in the reverse order.

Given a class-leader vector and corresponding weights $w_l$, the number of possible permutations is $$N_P = \frac{\left( \sum_l w_l \right)!}{\prod_l w_l!}. \qquad \text{eq. 11}$$

$N_P$ is known as the multinomial coefficient. To identify one among all possible permutations, a vector index $i_P$, $0 \leq i_P < N_P$, is useful for describing and understanding the encoding process and mapping of code vectors. Since all permuted vectors are composed of the same coordinate values but in different order, the absolute value, or length, of the code vectors is identical for all permutated vectors. Using the vector index, this is $$\|\tilde{x}_{i_P}\| = \sqrt{\Sigma_l w_l \mu_l^2} \, \forall i_P. \qquad \text{eq. 12}$$

The $N_P$ permutations of the class-leader vector altogether form a permutation codebook $\tilde{X}_P$.

A further issue in the quantization process relates to compaction or how to represent the various vectors with fewer class representatives, such that the errors introduced by information loss due to the compaction will be acceptably small, or at best not be noticeable, to a user.

One representation of a vector x based on the class-leader vector, $\tilde{x}_P$ of a permutation code that provides the minimum Euclidean distance is achieved as follows. For a vector x of dimension $L_v$, $x = [x_0 \; x_1 \ldots x_{L_v-1}]^T$ to be (further) quantized or compacted, permute the vector coordinates such that the components of the permuted vector $x^* = [x^*_0 \; x^*_1 \ldots x^*_{L_v-1}]^T$ are ordered in decreasing order $x^*_0 \geq x^*_1 \geq \ldots \geq x^*_{L_v-1}$. The required permutations are represented by a matrix $P_x$, $x^* = P_x \cdot x$. The ordered vector $x^*$ is represented by a class-leader vector as specified in equation 7 and that also has its components sequentially ordered according to magnitude.

For reconstructing x from $x^*$, the process is reversed $x = (P_x)^{-1} \cdot x^*$. The matrix $P = (P_x)^{-1}$ also provides a minimum Euclidean distance representative $\tilde{x}^*_P$ for the vector x to be quantized or compressed.

$$\tilde{x}^*_P = (P_x)^{-1} \cdot \tilde{x}_P. \qquad \text{eq. 13}$$

To achieve the compression a vector index, $i_P$, is determined for the vector representative $\tilde{x}^*_P$. This is achieved by a permutation to index mapping and which is preferably achieved by a mapping suggested by J. Pieter and M. Schalkwijk.

The mapping consequently transforms the permuted vector $\tilde{x}^*_P$ into an index $i_P$. A decoder realizes the reverse operation and maps the index $i_P$ back into a permuted vector $\tilde{x}^*_P$, corresponding to the original permuted vector. Consequently, there is a one-one mapping between permuted vector $\tilde{x}^*_P$ and index $i_P$, the index $i_P$ providing a representation of the permuted vector $\tilde{x}^*_P$ suitable for transmission, storage or further processing such as for channel encoding. In brief, the index is suitable for transfer on a communications channel. The number of indices, $|I_P|$, is equal to the number of possible permutations, $N_P$ (see equation 11).

U.S. Pat. No. 4,075,622 describes a method and apparatus for data compression which utilizes a random walk through Pascal's triangle directed by an incoming binary source sequence. The random walk starts at the apex of Pascal's triangle and proceeds downward according to an algorithm until it terminates at a boundary which has been constructed in such a way that the encoding of each source sequence can be accomplished in a fixed number of bits.

U.S. Pat. No. 6,054,943 describes a variable-to-block universal multilevel digital information compression making use of a random walk in Pascal's hypervolume, a multi-dimensional generalization of Pascal's triangle. Codewords and decoded source sequences are either determined in the encoder and decoder, respectively, on the fly at encoding/decoding or pre-computed and stored. Variable length sequences of source symbols are encoded into fixed length codeword blocks. Encoders and decoders including dedicated hardware including registers, counters and latches are disclosed as are flowcharts. FIG. 26 of U.S. Pat. No. 6,054,943 illustrates graphically an example encoding (and decoding) of an example sequence of a ternary source. Depending on the source sequence and for each incoming source symbol, a particular candidate prefix is selected and a running sum is updated. The final value of the running sum, rs, for a sequence of symbols $\{j_k\}_{k=1}^n$ corresponds at least to a part of an index or codeword and equals $$rs = \sum_{k=1}^{n} \sum_{i=0}^{j_k-1} \frac{(k-1)!}{(w_i^k - 1)! \prod_{\substack{p=0 \\ p \neq i}}^{m-1} (w_p^k)!}, \quad \text{eq. 14}$$

where $j_k \in [0, m-1]$ is the incoming symbol at stage k and where the summation is over all n incoming symbols and $w_i^k$ is the number of symbols $i \in [0, m-1]$ that have arrived after k stages. The outer sum is determined recursively by adding the inner summation for each incoming symbol to encode. The encoding is terminated at a particular element in Pascal's hyper volume. This point is added as a starting point prefix for the decoder to know where to start tracing back in Pascal's hyper volume. It is also suggested in U.S. Pat. No. 6,054,943 to add a prefix to allow uncoded transmission in order to avoid encoder expansion to happen for some sequences. At encoding, a recursion for determining the running sum for an incoming symbol j is $$rs \leftarrow rs + \sum_{i=0}^{j-1} oldPos * \frac{w_i}{w_j + 1}, \quad \text{eq. 15}$$

where oldPos is the old position in Pascal's hyper volume. The position in Pascal's hyper volume is similarly updated recursively for the next iteration, $$l \leftarrow l + 1, \quad \text{eq. 16}$$

$$oldPos \leftarrow oldPos * \frac{l}{w_j + 1}, \quad \text{eq. 17}$$

where l corresponds to the number of symbols that have come in.

The recursion for decoding works the path through Pascal's hyper volume for choosing a symbol j that provides a position that is not greater than a candidate for the corresponding position in the hyper volume. The recursion for the running sum in reverse direction, decoding position l of a codeword, in U.S. Pat. No. 6,054,943 is $$rs \leftarrow rs - \sum_{i=0}^{j-1} curPos * \frac{w_i}{l}, \quad \text{eq. 18}$$

with the associated recursions decoding next $$l \leftarrow l + 1 \quad \text{eq. 19}$$

$$curPos \leftarrow curPos * \frac{w_j}{l}. \quad \text{eq. 20}$$

Khalid Sayood, "*Introduction to Data Compression*, 2nd edition, 2000, pp. 290, 291" provides a first introduction to spherical vector quantizers. For the Gaussian probability distribution, the contours of constant probability are circles in two dimensions. In two dimensions an input vector can be quantized by transforming it into polar coordinates comprising radius, r, and phase, θ. Polar coordinates span the same space as do Cartesian coordinates. r and θ can either be quantized independently, or quantized values of r can be used as an index to a quantizer for θ. The advantage to quantizing r and θ independently is reduced complexity as compared to a quantizer for which the quantization of θ depends on the quantization of r. As mentioned above in relation to scalar quantizers, not making full use of interdependencies within a block tend to reduce performance.

Jon Hamkins, '*Design and analysis of spherical codes,*' Thesis submitted in partial fulfillment of the requirements for the degree of Doctor of philosophy in Electrical Engineering in the Graduate College of the University of Illinois at Urbana-Champaign, dated 1996, briefly defines and provides properties of the root lattices $A_k$, $D_k$, $E_8$ and $Z^k$ and their duals in chapter 2, the "root" relating to the root systems of certain Lie algebras. Hamkins also defines a codebook as a set of output points or vectors forming the code points or code vectors. A k-dimensional spherical code is defined as a finite set of points in $\mathbb{R}^k$ that lie on the surface of the k-dimensional unit radius sphere $\Omega_k$, $$\Omega_k \equiv \left\{ (x_1, x_2, \ldots, x_k) \in \mathbb{R}^k : \sum_{i=1}^{k} x_i^2 = 1 \right\}. \quad \text{eq. 21}$$

In chapter 6, Hamkins describes wrapped spherical codes as vector quantizers for a memoryless Gaussian source and provides an algorithmic description of an encoder in table 6.1 quantizing gain and shape of a vector independently, the gain corresponding to the length or radius of the vector, and the shape corresponding to the vector normalized to 1. The gain codebook is optimized by the Lloyd-Max algorithm. Since the PDF is known (Gaussian source), no training is required. The algorithmic description is also included in Jon Hamkins and Kenneth Zeger, *Gaussian Source Coding with Spherical Codes, IEEE Transactions on Information Theory*, vol. 48, No. 11, pp. 2980-2989 (2002).

SUMMARY

In prior art technology, the number of class-leader vectors for representing source data, e.g. speech, tend to be large, thereby requiring substantial storage capacity of e.g. codebook representation for encoding and decoding in digital communications equipment. A great number of class leaders requires a great time for determining the code vector in the encoding process in order to minimize distortion.

None of the cited documents provides a method or system of quantization or coding wherein a metric or distortion forming a criterion according to which a signal, or (using vector notation) code vector or codeword, to output for an unquantized input signal, or vector, is determined from a reduced set of code vectors of an E-lattice being linked to the (full) set of code vectors by a sign distribution.

In communications in general and in today's digital communications in particular, it is a challenge to provide communications resources meeting increasing amounts of data being communicated at an increasing rate while providing communications services at a decreasing cost. One crucial element for making digital communications financially and technically possible to a great number of people is efficient quantization of data for efficient signaling. Speech encoding and decoding for speech communications in mobile telephone systems, sound encoding for storage of songs and decoding for reproducing the sound in portable audio players or surround sound equipment reproducing movie sound, or other multi-channel sound, stored on a DVD or CD or received from public broadcasting companies by wire or over the air and image coding and decoding for digital television are some communications examples well known to the public.

For further development, it is a challenge to reduce complexity or storage requirements for a given code, or maintain complexity or storage requirements while allowing more complex coding principles, and there is a need of improved encoding and decoding efficiency.

Consequently, it is an object of example embodiments of the invention to provide reduced processing or storage requirements compared to processing required for a representation based on a set of class-leader vectors compared to today's requirements for given codes.

It is an object of a preferred example embodiment of the invention to determine a quantization output from a reduced set of code vectors providing the same metric/distortion and output as if determined from the full set of code vectors.

It is also an object of example embodiments of the invention to allow for more complex encoding and decoding without increasing cost or complexity of encoders or decoders.

Further, it is an object of an embodiment of the invention to allow quantization or coding of signals being less restricted to particular block lengths, corresponding in vector notion to the dimension of the vector space.

It is an object of an embodiment of the invention to provide signals or signaling representation by sub-division of a codebook facilitating a one-one representation of class-leader vectors (using vector notation) with a (smaller) number of vectors suitable for storage in electronic, magnetic or optic storage media or representation for communication signaling.

Further, it is an object of a preferred embodiment of the invention to provide associated indexing for communication on a communications channel.

The invention provides a method and system implementing sub-dividing a set of class-leader vectors of a vector quantization encoder or decoder for encoding and decoding of communications data and mapping of corresponding data as described in detail below in relation to encoding and decoding processes.

BRIEF DESCRIPTION OF THE DRAWINGS

FIG. 1 schematically illustrates a sampler, a quantizer and a coder according to prior art.

FIG. 2 illustrates a simplified block diagram for vector quantization according to prior art.

FIG. 3 illustrates schematically transmission on a communications channel according to prior art.

FIG. 4 demonstrates schematically a flowchart for iteratively determining a codebook according to a generalized Lloyd algorithm of prior art.

FIG. 5 illustrates an example two dimensional hexagonal lattice in prior art.

FIG. 6 depicts a block diagram of an example shift register according to prior art.

FIG. 7 shows a basic block diagram for parallel quantization of a radius and a normalized vector according to prior art.

FIG. 8 shows a basic block diagram for serial quantization of a radius and a normalized vector according to an example mode of the invention.

DETAILED DESCRIPTION

Figure 9:
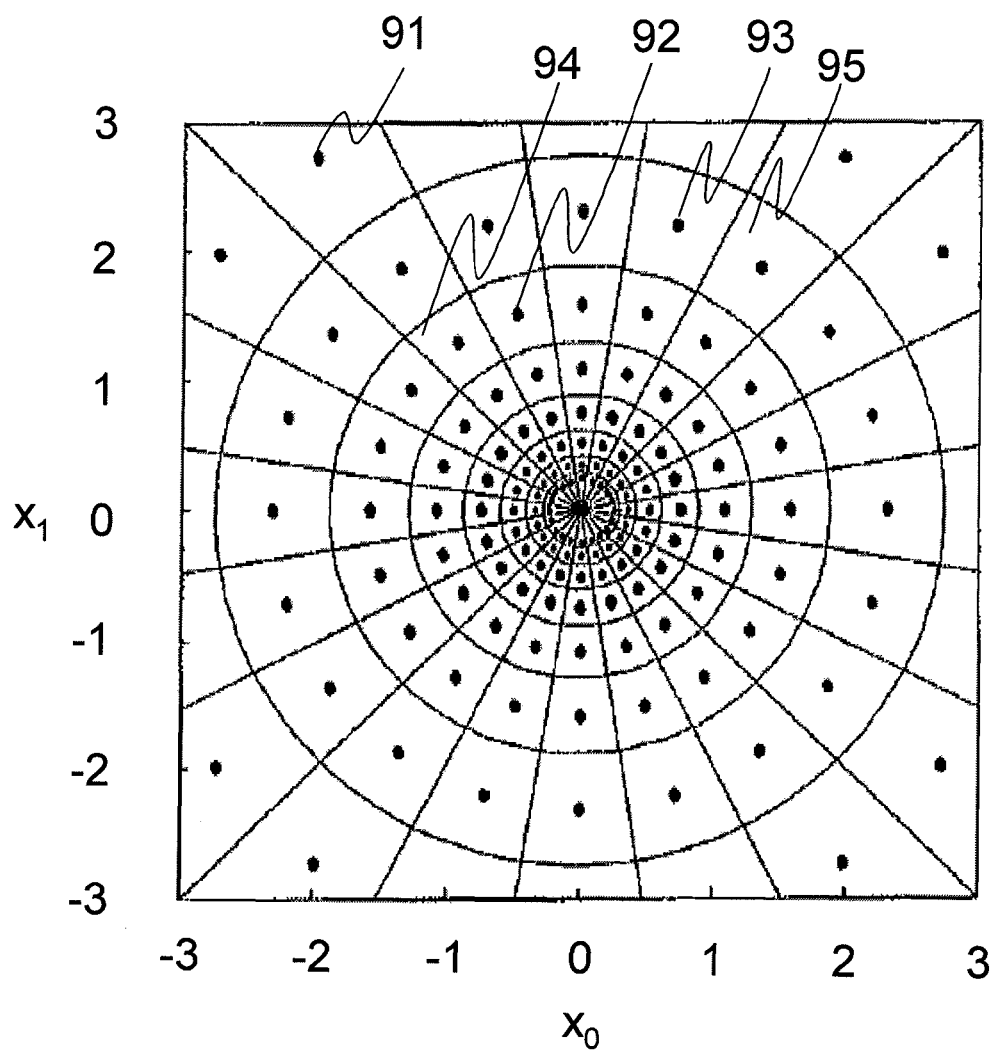
FIG. 9 plots an example distribution of code vectors according to the invention.

Vector quantizers based on structured codebooks generally provide a good compromise between memory requirement, computational complexity and quantization performance for practical use. For a given input signal probability distribution function, PDF, the theoretically optimal code-vector point-density-function for a given input signal PDF is well approximated by structured codebooks such as lattice codebooks and permutation codebooks. These codebooks are not stored completely in memory and are searched efficiently for codebooks according to the invention.

Knowledge on the probability distribution function, PDF, is required for the structured codebooks. It is not useful to assume a certain (statistical) characteristic of audio signals. Worst case assumptions are preferably made so that the designed VQ has good performance even for the signal that is hardest to quantize. Among all signal characteristics, Gaussian noise has the highest differential entropy. Therefore, following the worst case approach, a quantizer for audio coding should preferably be designed to have good performance for Gaussian sources.

Spherical vector quantization, SVQ, is a quantization that approximates the optimal code-vector point-density for the Gaussian distribution and at the same time can be realized efficiently. If properly designed, the achieved signal to noise ratio, SNR, related to SVQ is independent from the PDF of the input signal and from the dynamics of the input signal for a wide dynamic range.

In the course of the quantization process, an example input signal representing an input signal vector, x, is transformed into a signal representing a radius, $R_x = \|x\|$, of the vector, x, and a normalized vector $c = x/R_x$. Both the radius and the normalized vector will be quantized to produce a quantized radius, $\tilde{R}_x = Q_R(R_x)$, and a quantized normalized vector $\tilde{c} = Q_{sp}(c)$, with the codebooks $\tilde{X}_R$ for the radius and $\tilde{X}_{sp}$ for the normalized vector. In the sequel $\tilde{c} = Q_{sp}(c)$ is referred to as a spherical code vector and $\tilde{X}_{sp}$ as the codebook for the spherical vectors. If the radius is quantized by means of logarithmic quantization, e.g. A-law quantization well known from compression of PCM in telephone systems, the quantization signal to noise ratio, SNR, is independent of the probability density function of the input signal. This is also referred to as logarithmic SVQ.

The quantized output signal vector is $$\tilde{x} = \tilde{c} \cdot \tilde{R}_x.  \qquad \text{eq. 22}$$

FIG. 7 shows a basic block diagram for parallel quantization of a radius (72) and a normalized vector (73). The radius and normalized vector are quantized independently. Both the block (71) separating the radius and the spherical vector and the quantizers (72), (73) are preferably included in an encoder entity, whereas the combining entity (74) is preferably included in a decoder entity. The output signal representing an output vector, $\tilde{x}$, of the combining entity (74) is the reconstructed value of the input signal represented as input vector x. The figure does not include processing equipment of index determining for reasons of simplicity. Signaling carrying codewords corresponding to indices are preferably transferred on a communications channel. Accordingly, the invention preferably includes processing equipment for index determining.

FIG. 8 shows a basic block diagram for serial quantization of a radius (82) and a normalized vector (83). As for the parallel quantization, both the block (81) separating the radius and the spherical vector and the quantizers (82), (83) are preferably included in an encoding entity, whereas the combining entity (84) is preferably included in a decoder entity. In contrast to the parallel realization the radius quantization is performed after the quantization of the normalized vector, c. This will allow for considering the curvature of the quantization cells, which is effective particularly for large cells. Especially for low bit rates, the sequential approach provides a slightly higher performance. The output signal representing an output vector, $\tilde{x}$, of the combining entity (84) is the reconstructed value of the input signal represented as input vector x. The figure does not include index determining for $\tilde{R}_x$ or $\tilde{x}$, respectively. In similarity with the parallel quantization, an encoder preferably comprises equipment for determining one or more indices. Signaling carrying codewords corresponding to indices rather than quantized vectors are preferably transferred on a communications channel.

FIG. 9 plots an example distribution of code vectors, indicated by black points (91), (92), (93), of spherical vector quantization with quantization cells (94), (95) corresponding to parallel quantization for $L_v = 2$ and signal vectors $x = [x_0\ x_1]$. The code vectors are located on the surface of spheres, which for the 2-dimensional case are circles. The radii differs for code vectors on different circles (92), (93).

There are different encodings for representing the quantized vectors (code vectors). The scalar radius quantizer, $Q_R$, (72), (82) is preferably realized by electrical circuitry implementing a lookup table, since the number of quantization and reconstruction levels is usually modest and, consequently, the number of entries required to be stored is small, particularly if logarithmic quantization is applied. For the serial quantizer in FIG. 8, the quantization process is, e.g., realized by processing circuitry implementing a bisection based on a table containing all interval bounds. The sequential combination of the quantizers is referred to as re-quantization of the radius.

Denote a quantized vector (code vector) as $\tilde{x}_{i_Q}$. The index $i_Q$ of the code vector $\tilde{x}_{i_Q}$ denotes required and sufficient information to reconstruct the code vector in the decoder. Considering, e.g., logarithmic SVQ, there are two indices, $i_{Q,R}$ and $i_{Q,sp}$ corresponding to the selected quantization reconstruction levels of the radius and the quantized normalized vector, respectively. There are two modes of combining the indices into a single index in the invention. The former is preferred due to a small advantage for transfer over communication channels introducing channel errors. They are $$i_Q = i_{Q,R} \cdot N_{sp} + i_{Q,sp}, \text{ and} \qquad \text{eq. 23}$$

$$i_Q = i_{Q,sp} \cdot N_R + i_{Q,R}, \qquad \text{eq. 24}$$

where $N_{sp}$ is the number of code vectors for the normalized vector and $N_R$ is the number of available quantizer reconstruction values for the radius.

A Gosset Low Complexity Vector Quantizer according to an embodiment of the invention is based on code vectors from a lattice derived from the well known Gosset lattice, $E_8$. The $E_8$ lattice is known to have the highest possible density of points in eight dimensions. The invention identifies advantages as regards encoding and decoding that can be achieved based on a generalized Gosset lattice, E-lattice. Thereby efficiency gains as regards computational complexity and memory/storage requirements are achieved.

The Gosset lattice was originally designed for eight dimensions, $L_v = 8$. In order not to limit the invention to $L_v = 8$, the E-lattice (to be further explored as will be explained below) is generalized in the invention from the Gosset lattice to an arbitrary dimension $L_v$ as follows $$E_{L_v} = D_{L_v} \cup (D_{L_v} + v): v = [½ \ldots ½], \qquad \text{eq. 25}$$

where $$D_{L_v} : y \in \left\{ [y_0 \; y_1 \; \ldots \; y_{L_v-1}] : y_j \in \mathbb{Z}, \sum_{j=0}^{L_v-1} y_j \equiv 0 \; (\text{modulo } 2) \right\}, \quad \text{eq. 26}$$

is the checkerboard lattice, or D-lattice, of the same number of dimensions, $L_v$, as the E-lattice. The well-known modulo operation provides the remainder, so that (modulo 2) refers to the remainder when dividing by 2.

Lattice vectors with a same distance to the origin define a shell, S, of the lattice. To simplify notion, for the generalized Gosset lattice, or E-lattice, $E_{L_v}$, a shell with a squared distance to the origin equal to 2u is denoted $S_u^{(E_{L_v})}$. The radius of the particular shell of the E-lattice is denoted $R_u^{(E_{L_v})}$. Consequently, the shell is defined as $$S_u^{(E_{L_v})} : y \in \left\{ E_{L_v} : \|x\| = R_u^{(E_{L_v})} \right\}. \quad \text{eq. 27}$$

Each E-lattice spherical vector codebook, $\tilde{X}_{sp,u}^{(E_{L_v})}$, is composed of all vectors related to a specific shell of squared radius 2u, normalized to radius 1, $$\tilde{X}_{sp,u}^{(E_{L_v})} : \tilde{c} = \frac{y}{\sqrt{2u}} \; \forall \; y \in S_u^{(E_{L_v})}. \quad \text{eq. 28}$$

The effective bit rate of the E-lattice is $$r_{eff,u}^{(E_{L_v})} = \frac{1}{L_v} \cdot \log_2\left(N_{sp,u}^{(E_{L_v})}\right), \quad \text{eq. 29}$$

where $N_{sp,u}^{(E_{L_v})}$ is the number of code vectors located on a shell with radius $\sqrt{2u}$ of $E_{L_v}$. The number of code vectors, $N_{sp,u}^{(E_{L_v})}$, located on the various shells of $E_{L_v}$ depends on the radius $\sqrt{2u}$ and the particular E-lattice. Table 1 lists the number of code vectors versus half the squared radius for the well known Gosset lattice, $E_8$. Also included in the table is the respective effective bit rate to address the code vectors of the shell.

Given a specific effective target bit rate per sample for the spherical codebook, $r_{eff,sp}$, shells of successively greater radii of the lattice of interest are investigated one by one, starting with a shell of smallest radius, i.e. smallest natural number u, when constructing the codebook. The codebook is finally based upon a shell $u_{sp}$, with as many code vectors as possible provided that the effective bit rate per sample does not exceed the effective target bit rate per sample, $$u_{sp} = \underset{\substack{u \in \mathbb{N}: \\ r_{eff,u}^{(E_{L_v})} \leq r_{eff,u}}}{\operatorname{argmax}} N_{sp,u}^{(E_{L_v})}, \quad \text{eq. 30}$$

where $\mathbb{N}$ denotes natural numbers.

TABLE 1

Number of code vectors on different shells of the Gosset lattice.

| u | $N_{sp,u}^{(E8)}$ | $r_{eff,u}^{(E8)}$ |
|---|---|---|
| 1 | 240 | 0.9884 |
| 2 | 2160 | 1.3846 |
| 3 | 6720 | 1.5893 |
| 4 | 17520 | 1.7621 |
| 5 | 30240 | 1.8605 |
| 6 | 60480 | 1.9855 |
| 7 | 82560 | 2.0416 |
| 8 | 140400 | 2.1374 |
| 9 | 181680 | 2.1839 |
| 10 | 272160 | 2.2568 |
| 15 | 846720 | 2.4614 |
| 20 | 2207520 | 2.6342 |
| 30 | 7620480 | 2.8577 |

For reasons of simplicity, a codebook for encoding and decoding according to the invention based on a particular E-lattice is also referred to by the particular shell or by the half of its squared radius, $u_{sp}$.

The E-lattice is invariant under an interchange of vector coordinates. All spherical code vectors can be grouped into a number, $M_{E,u}^{(E_{L_v})}$, of equivalence classes, $E_m$, m=0, 1, ..., $M_{E,u}^{(E_{L_v})}$ −1. Each equivalence class is composed of vectors generated by a permutation code $P_m$ given the class-leader vector $\tilde{c}_{E, P_m}$. Hence, the spherical vector codebook $\tilde{X}_{sp,u}^{(E_{L_v})}$ can be expressed as a superposition of $M_{E,u}^{(E_{L_v})}$ codebooks, $\tilde{X}_{P_m}$, of a permutation code $P_m$, $$\tilde{X}_{sp,u}^{(E_{L_v})} = \bigcup_{m=0}^{M_{E,u}^{(E_{L_v})}-1} \tilde{X}_{P_m}. \quad \text{eq. 31}$$

The respective number of equivalence classes related to spherical codebooks of different shells with half squared radius u=1, 2, ..., 10 are listed in table 2.

Figure 10:
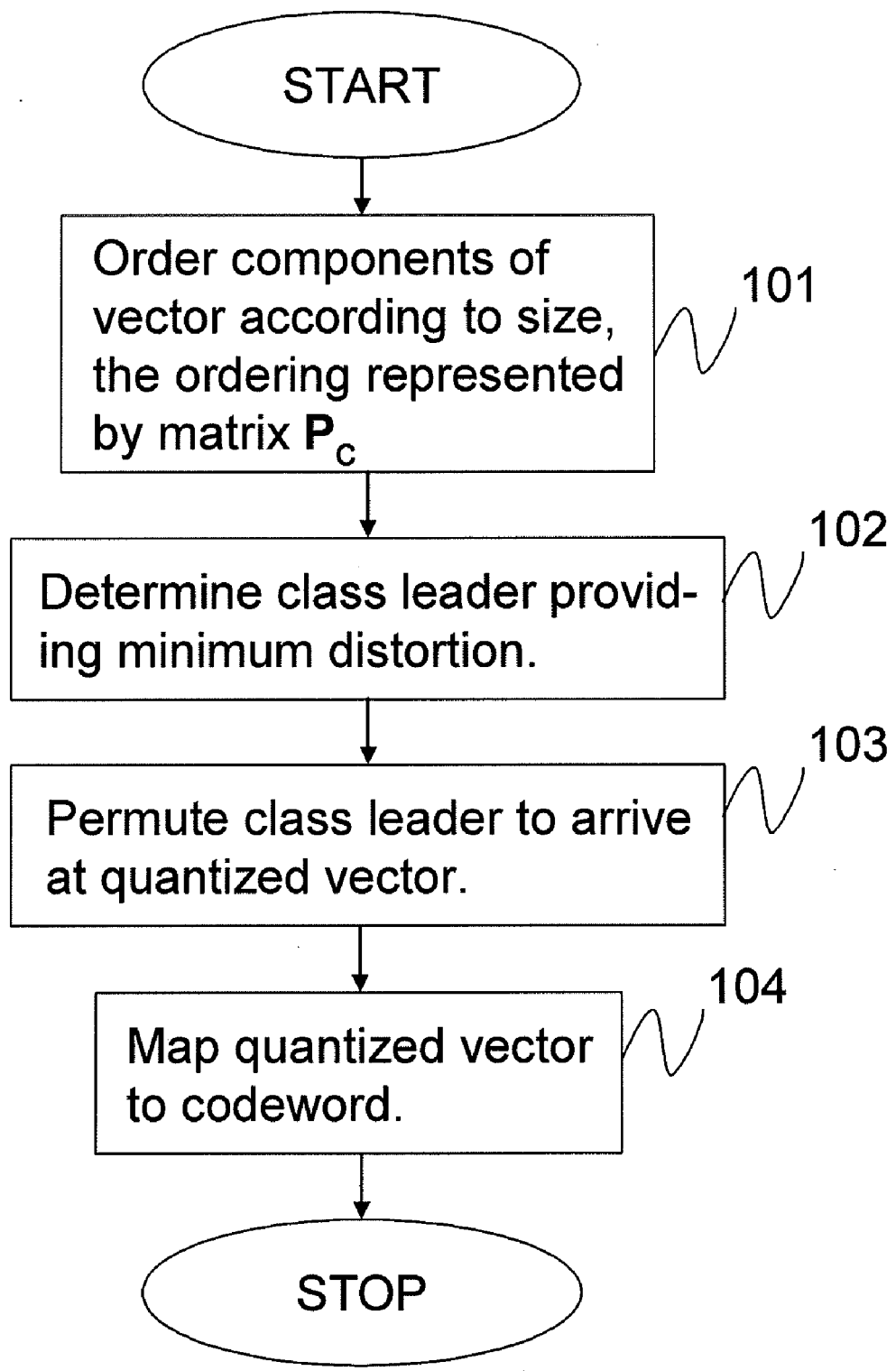
FIG. 10 illustrates a flowchart of an efficient quantization procedure according to the invention.

With the decomposition of the E-lattice spherical codebook into equivalence classes and the quantization procedure related to permutation codes, an efficient quantization procedure according to the invention is as follows and as also illustrated in the flowchart of FIG. 10.

For a normalized vector c to be quantized, reordering corresponding to a permutation matrix $P_c$ is determined such that when applied to the normalized vector, the coordinates of the vector are rearranged in decreasing order (101). The permuted vector $c^* = P_c \cdot c$ is $$c^* = [c^*_0 c^*_1 \ldots c^*_{L_v-1}]^T, \quad \text{eq. 32}$$

where $c^*_0 \geq c^*_1 \geq \ldots c^*_{L_v-1}$.

Class-leader vectors are usually pre-stored in read-only memory or other storage medium. From the set of all the class-leader vectors, $\tilde{c}_{E, P_m}$, m=0, 1, ..., $M_{E,u}^{(E_{L_v})}$ −1, a candidate $m = m_Q \in [0, M_{E,u}^{(E_{L_v})} -1]$ is, e.g., searched and selected (102) by processing circuitry from the equivalence classes $E_m$, m∈[0, $M_{E,u}^{(E_{L_v})}$ −1], that out of the stored class leader vectors, provides minimum distortion with respect to the (un-quantized) vector c*, according to a predefined criterion, such as minimum squared Euclidean distance, $$m_Q = \underset{m=0,1,\ldots,M_{E,u}^{(E_{L_v})}-1}{\operatorname{argmin}} \|\tilde{c}_{E,P_m} - c^*\|^2. \qquad \text{eq. 33}$$

Since the vectors $\tilde{c}_{E,P_m}$ and $c^*$ are of fixed (normalized) length, minimizing, and distortion in equation 33 is equivalent to maximizing the correlation or scalar product of the vectors $$m_Q = \underset{m=0,1,\ldots,M_{E,u}^{(E_{L_v})}-1}{\operatorname{argmax}} \tilde{c}_{E,P_m} \cdot c^*. \qquad \text{eq. 34}$$

The spherical code vector preferred to represent c is determined (103) by processing the class-leader vector representative corresponding to applying the inverse of the permutation matrix $P=(P_c)^{-1}$. Hence, the spherical code vector determined to represent the normalized vector c is $$\tilde{c} = (P_c)^{-1} \cdot \tilde{c}_{E,P_{m_Q}}. \qquad \text{eq. 35}$$

The quantized vector $\tilde{c}$ is mapped (104) to a codeword, or index, $i_{Q,sp}$ in digital signal processing equipment. This is preferably achieved by applying the Schalkwijk algorithm, well-known in the art, to the particular code of the invention as follows.

Figure 11:
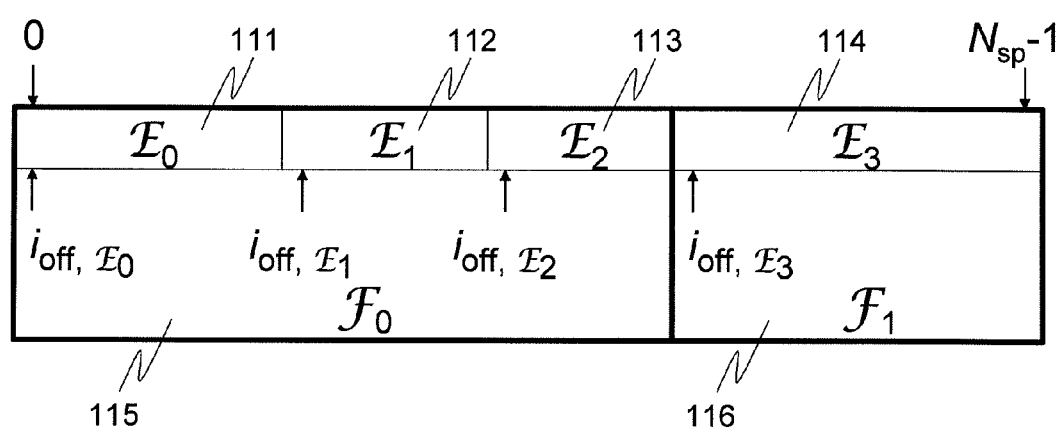
FIG. 11 illustrates schematically sub-ranges corresponding to equivalence classes in relation to root-vector classes for a simplified example according to the invention.

Given more than one permutation code, in the range of all possible indices $i_{Q,sp} \in [0, N_{sp}-1]$ respective sub-ranges (111), (112), (113), (114) corresponding to the $M_{E,u}^{(E_{L_v})}$ equivalence classes, $E_0$, $E_1$, $E_2$ and $E_3$ are determined as chematically illustrated in FIG. 11, for the example case of four equivalence classes. The example sub-ranges are not uniform. Index offset corresponding to the sub-ranges, $$i_{\mathit{off},E_0}, i_{\mathit{off},E_1}, \ldots, i_{\mathit{off},E_{M_{E,u}^{(E_{L_v})}-1}},$$

included in FIG. 11 for $M_{E,u} M_{E,u}^{(E_{L_v})} -1=3$, are preferably stored for each of the sub-ranges (111), (112), (113), (114) to speed-up encoding or decoding and then need not be transferred on the communications channel.

For the sub-range (111), (112), (113), (114), corresponding to equivalence class $E_{m_Q}$ digital signal processing equipment determines an index $i_P$ in analogy with prior art methods. Thus, the desired index of the quantized vector $\tilde{c}$ is determined in the signal processing as $$i_{Q,sp} = i_{\mathit{off},m_Q} + i_P. \qquad \text{eq. 36}$$

The determining of the index $i_P$ is described in brief as follows. For an index range $I_P$, the number of indices is $N_P$. Assume that $\tilde{c}_j = \mu_{l_j}$, then $L_v - 1$ coordinates remain to be determined, i.e. to be associated to a specific value $\mu_l$. The number of possible permutations for the remaining sub-vector is calculated from the number of permutations in equation 11 with adjusted weights $w_l^{(adj)}$ $$w_l^{(adj)} = \begin{cases} w_l, & l = l_j \\ w_l - 1, & l \neq l_j. \end{cases} \qquad \text{eq. 37}$$

For each choice of $l_j$, the number of possible permutations of the sub-vector comprising the remaining vector components defines a sub-range of indices, provided $\tilde{c}_j = \mu_{l_j}$. This sub-range is denoted $I_{\tilde{c}_{P,j} = \mu_{l_j}}$. Thereby, the index range $I_P$ is sub-divided into sub-ranges $$I_P = \bigcup_{l_j=0}^{l_P-1} I_{\tilde{c}_{P,j} = \mu_{l_j}}. \qquad \text{eq. 38}$$

The number of indices in a sub-range associated with a particular value $\mu_{l_j}$ is $$|I_{\tilde{c}_{P,j} = \mu_{l_j}}| = \frac{\left(\sum_l w_l - 1\right)!}{\prod_{l:l \neq l_j} w_l! \cdot (w_{l_j} - 1)!}. \qquad \text{eq. 39}$$

The sub-ranges are further sub-divided into smaller sub-ranges, and at last there is a single index.

Figure 12:
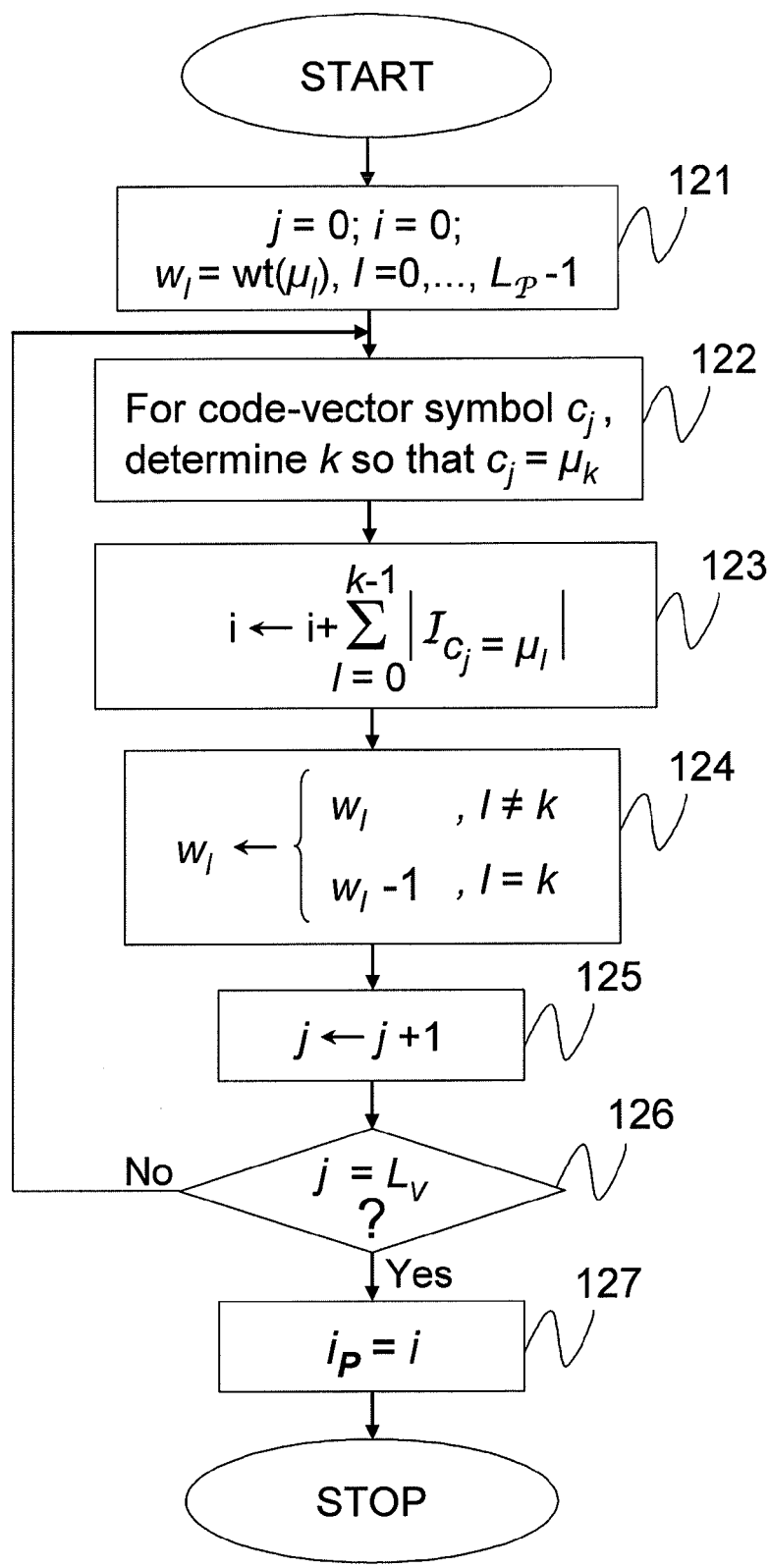
FIG. 12 displays a flowchart illustrating example indexing in an embodiment of the invention.

FIG. 12 displays a flowchart illustrating an example indexing as explained above for encoding of a sequence for communication over a communications channel. Indexing is initialized (121), where wt(•) denotes the weight or the number of occurrences of a particular symbol. The rank of an incoming symbol $\tilde{c}_j$ is determined (122) and the index is updated accordingly by the sum of number of indices in corresponding sub-range (123). The weights are updated (124) and the recursion continues for the next incoming symbol (125) until the last $L_V$ symbol of the code vector have been encoded (126). The index then finally results from the last recursion (127).

The invention identifies that in many cases a great number of equivalence classes are involved depending on, e.g., dimensionality and sphere radius. As a non-exclusive example illustrated in table 2, the number of equivalence classes, $M_{E,10}^{(E_8)}$, for u=10 is 162. A brute-force implementation of the quantization process will, for such cases, tend to require great memory and computational capacities in terms of number of bytes and number of operations per second, respectively.

TABLE 2

Number of equivalence classes and root classes for different shells of the Gosset lattice.

| u | $M_{E,u}^{(E_8)}$ | $M_{F,u}^{(E_8)}$ |
|---|---|---|
| 1 | 8 | 2 |
| 2 | 15 | 3 |
| 3 | 24 | 3 |
| 4 | 42 | 5 |
| 5 | 54 | 5 |
| 6 | 57 | 5 |
| 7 | 103 | 8 |
| 8 | 119 | 9 |
| 9 | 124 | 9 |
| 10 | 162 | 11 |

According to a preferred embodiment of the invention, the requirements on the quantization equipment is substantially relieved by a quantizer implementing grouping of equivalence classes, $E_m$, in root classes, $F_{m'}$. For the example radius corresponding to u=10, the number of classes is reduced from 162 to 11 for the Gosset lattice, or more than by a factor of 10, providing a load reduction in a corresponding order of magnitude, while providing identically the same codewords and distortion, e.g. in terms of minimum Euclidean distance.

For the definition of the root classes consider two categories of code vectors, labeled categories A and B. Vectors of category A are in $D_{L_v}$ and comply with the requirement in equation 26 and vectors of category B are in $D_{L_v}+v$, $v=[\frac{1}{2} \ldots \frac{1}{2}]$ and comply with the requirement in equation 25. Consider a spherical code vector, $\tilde{c}$, of category A, and denote it $\tilde{c}^{(A)}$. When changing the sign of a single coordinate position, e.g. position $j_0$, the resulting vector is also a vector of category A, since $$\sum_{j=0}^{L_v-1} \tilde{c}_j^{(A)} - 2\tilde{c}_{j_0}^{(A)} \equiv 0 (\text{modulo } 2), \qquad \text{eq. 40}$$

and the radius of the vector remains unchanged.

Consider a spherical code vector, $\tilde{c}$, of category B, and denote it $\tilde{c}^{(B)}$. When changing the sign of exactly two coordinate positions, e.g. positions $j_0$ and $j_1$, the resulting vector is also a vector of category B, since $$\sum_{j=0}^{L_v-1} \tilde{c}_j^{(B)} - 2\tilde{c}_{j_0}^{(B)} - 2\tilde{c}_{j_1}^{(B)} \equiv \sum_{j=0}^{L_v-1} \tilde{c}_j^{(B)} (\text{modulo } 2), \qquad \text{eq. 41}$$

and each vector $\tilde{c}^{(B)}$ of category B, can be expressed in terms of a vector comprising integer components, $\kappa_j^{(D_{L_v})}$, in $D_{L_v}$ as for y in equation 26 from the relation $\tilde{c}_j^{(B)} = \kappa_j^{(D_{L_v})} + \frac{1}{2}$, while the radius of the vector remains unchanged.

According to the invention, a sign parity check sum for code vectors $\tilde{c}$, is defined.

$$\text{sgn}par(\tilde{c}) = \sum_{j=0}^{L_v-1} \text{sgn}(\tilde{c}_j)(\text{modulo } 2), \qquad \text{eq. 42}$$

where $$\text{sgn}(\tilde{c}_j) = \begin{cases} 0, & \text{if } \tilde{c}_j \geq 0 \\ 1, & \text{if } \tilde{c}_j < 0. \end{cases} \qquad \text{eq. 43}$$

It is observed that all class-leader vectors $\tilde{c}_{E, P_m}$ can be constructed from class-leader root-vectors $\tilde{c}_{F, P_{m'}}$ for $0 \leq m' < M_F^{(E_{L_v})}$, where $M_F M_F^{(E_{L_v})}$, is the number of root classes, $F_{m'}$, each comprising one class-leader root-vector $\tilde{c}_{F, P_{m'}}$. The required codebook size, e.g., is substantially reduced by doing so for most codes based on E-lattices of practical interest. Also, the encoding complexity is reduced, since not all class leader vectors need to be searched during the encoding.

According to the invention, preferably the class-leader root-vectors are searched. In the preferred embodiment, there is a small additional computational load due to searching for category-B vectors providing minimum distortion. A class-leader root-vector is composed of $L_F$ different values $\mu_l \in \mathbb{Z}$, each occurring $w_l$ times, where $w_l$ also being referred to as the weight of $\mu_l$.

Similar to the class-leader vector in equation 7, the class-leader root-vector can be expressed as $$\tilde{c}_{F,P_{m'}} = [c_{F,P_{m'},0} \; c_{F,P_{m'},1} \; \cdots \; c_{F,P_{m'},L_v-1}]^T \qquad \text{eq. 44}$$
$$= [\underbrace{\mu_0 \mu_0 \cdots \mu_0}_{w_0} \; \underbrace{\mu_1 \mu_1 \cdots \mu_1}_{w_1} \; \cdots \; \underbrace{\mu_{L_F-1}\mu_{L_F-1} \cdots \mu_{L_F-1}}_{w_{L_F-1}}]^T,$$

where, $\mu_l \geq 0$ for all class-leader root-vectors. The respective number, $N_{m'}^{(F)}$, of class-leader vectors of a particular category equals the number of possible sign permutations related to the weights, $w_l$, of non-zero coordinate values, $\mu_l \neq 0$ for the class-leader root-vector class. For a category A class-leader root-vector of equivalence class $E_{m'}$, this number is $$N_{m'}^{(F)} = \prod_{l=0: \mu_l \neq 0}^{L_F-1} (w_l + 1). \qquad \text{eq. 45}$$

For a category B class-leader root-vector, the number of possible sign permutations is considered for pair wise components in order to maintain sign parity. Accordingly, the respective numbers of sign permutations for the cases of even and odd sign parity are $$N_{m'}^{(F)} = \begin{cases} \dfrac{\left(\prod_{l=0:\mu_l \neq 0}^{L_F-1}(w_l+1)\right)+1}{2}, & \text{for even sign parity} \\[2ex] \dfrac{\left(\prod_{l=0:\mu_l \neq 0}^{L_F-1}(w_l+1)\right)-1}{2}, & \text{for odd sign parity.} \end{cases} \qquad \text{eq. 46}$$

The number of root classes for different shells of the Gosset, $E_8$, are also listed in table 2.

As an example to demonstrate how to construct the class-leader vectors from the class-leader root-vectors, the class-leader vectors for a shell with radius 2, corresponding to u=2 are included in table 3.

TABLE 3

Class-leader root-vectors and corresponding class-leader vectors, u = 2.

| Category | $\tilde{c}_{F,P_{m'}}$ | $\tilde{c}_{E,P_m}$ |
|---|---|---|
| A | $[1\ 0\ 0\ 0\ 0\ 0\ 0\ 0]_T$ | $[\ 1\ 0\ 0\ 0\ 0\ 0\ 0\ 0\ ]_T$ |
| | | $[\ 0\ 0\ 0\ 0\ 0\ 0\ 0\ -1]_T$ |
| A | $[1/2\ 1/2\ 1/2\ 1/2\ 0\ 0\ 0\ 0]_T$ | $[\ 1/2\ 1/2\ 1/2\ 1/2\ 0\ 0\ 0\ 0\ ]_T$ |
| | | $[\ 1/2\ 1/2\ 1/2\ 0\ 0\ 0\ 0\ \overline{1/2}\ ]_T$ |
| | | $[\ 1/2\ 1/2\ 0\ 0\ 0\ 0\ \overline{1/2}\ \overline{1/2}\ ]_T$ |
| | | $[\ 1/2\ 0\ 0\ 0\ 0\ \overline{1/2}\ \overline{1/2}\ \overline{1/2}\ ]_T$ |
| | | $[\ 0\ 0\ 0\ 0\ \overline{1/2}\ \overline{1/2}\ \overline{1/2}\ \overline{1/2}\ ]_T$ |
| B | $[3/4\ 1/2\ 1/2\ 1/2\ 1/2\ 1/2\ 1/2\ 1/2]_T$ | $[\ 3/4\ 1/2\ 1/2\ 1/2\ 1/2\ 1/2\ 1/2\ \overline{1/2}\ ]_T$ |
| | | $[\ 3/4\ 1/2\ 1/2\ 1/2\ 1/2\ \overline{1/2}\ \overline{1/2}\ \overline{1/2}\ ]_T$ |
| | | $[\ 3/4\ 1/2\ 1/2\ \overline{1/2}\ \overline{1/2}\ \overline{1/2}\ \overline{1/2}\ \overline{1/2}\ ]_T$ |
| | | $[\ 3/4\ \overline{1/2}\ \overline{1/2}\ \overline{1/2}\ \overline{1/2}\ \overline{1/2}\ \overline{1/2}\ \overline{1/2}\ ]_T$ |
| | | $[\ 1/2\ 1/2\ 1/2\ 1/2\ 1/2\ 1/2\ 1/2\ \overline{3/4}\ ]_T$ |
| | | $[\ 1/2\ 1/2\ 1/2\ 1/2\ 1/2\ \overline{1/2}\ \overline{1/2}\ \overline{3/4}\ ]_T$ |
| | | $[\ 1/2\ 1/2\ 1/2\ \overline{1/2}\ \overline{1/2}\ \overline{1/2}\ \overline{1/2}\ \overline{3/4}\ ]_T$ |
| | | $[\ 1/2\ \overline{1/2}\ \overline{1/2}\ \overline{1/2}\ \overline{1/2}\ \overline{1/2}\ \overline{1/2}\ \overline{3/4}\ ]_T$ |

In the application of lattice vector quantization, the number of code vectors is limited and only a limited set of the vectors constructed by the lattice rule is considered.

The computational burden of quantization processing is significantly reduced due to example embodiments of the invention as explained above.

Lattice vector quantizers in general are very well suited for quantization also for the reason that no explicit codebook has to be stored but could be determined from, e.g., its generator matrix. When lattices are used for generating a codebook, the codebook will be structured, thereby facilitating fast search for code vectors. In brief, lattice vector quantization is an efficient example of quantization.

Figure 13:
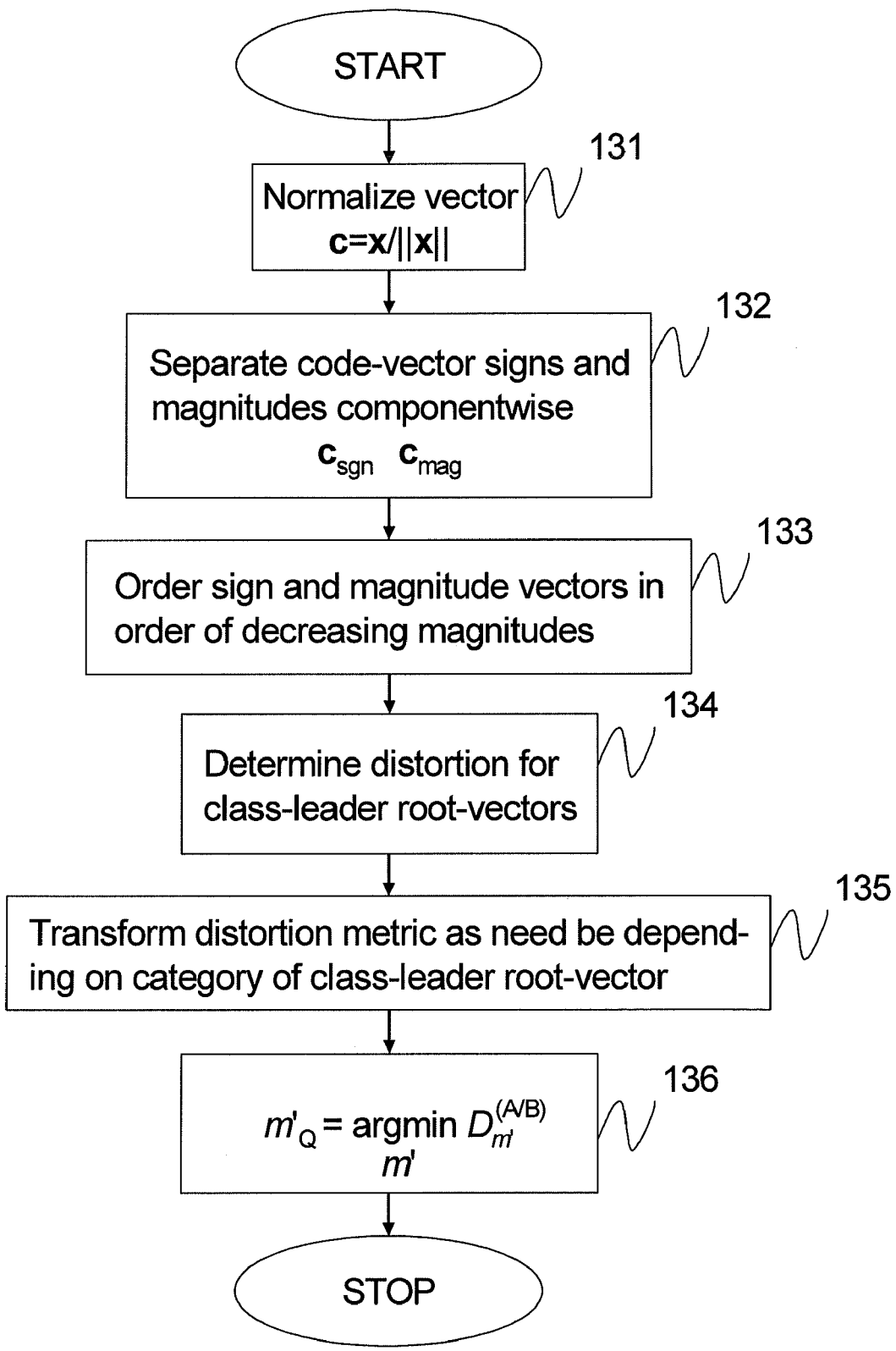
FIG. 13 depicts a basic flowchart for quantization according to an embodiment of the invention.

FIG. 13 depicts a basic flowchart for quantization according to an embodiment of the invention. For a vector x to be quantized, it is preferably normalized to a vector c of radius 1 (131) to simplify subsequent processing. Each component of the (normalized) vector is separated into respective magnitude and sign to form a magnitude vector and a sign vector (132), $$c_{mag}=[|c_0|\ |c_1|\ \ldots\ |c_{L_v-1}|]^T,\text{ and} \quad \text{eq. 47}$$

$$c_{sgn}=[\text{sgn}(c_0)\ \text{sgn}(c_1)\ \ldots\ \text{sgn}(c_{L_v-1})]^T. \quad \text{eq. 48}$$

The magnitude vector is permuted to arrange the components in decreasing order (133), $$c^*_{mag}=P_c\cdot c_{mag}, \quad \text{eq. 49}$$

and the sign vector is permuted accordingly (133), $$c^*_{sgn}=P_C\cdot c_{sgn}, \quad \text{eq. 50}$$

Using component-wise notion, the permuted magnitude vector can also be written $$c^*_{mag}=[c^*_{mag,0}c^*_{mag,1}\ \ldots\ c^*_{mag,L_v-1}]^T,\text{ and} \quad \text{eq. 51}$$

$$c^*_{sgn}=[c^*_{sgn,0}c^*_{sgn,1}\ \ldots\ c^*_{sgn,L_v-1}]^T. \quad \text{eq. 52}$$

A metric is usually considered a quantity to be maximized. However, this specification preferably refers to a quantity to be minimized, similar to a distance. The difference merely resides in a different sign. The negative distance is maximized when the distance is minimized. A distortion metric $D_{m'}$, preferably a Euclidean distance, is determined for, preferably, each of the class-leader root-vectors, $\tilde{c}_{F,P_m}$, in relation to the permuted magnitude vector $c^*_{mag}$ (134), $$D_{m'} = \|\tilde{c}_{F,P_{m'}} - c^*_{mag}\|^2, 0 \le m' < M_F^{(E_{L_v})}. \qquad \text{eq. 53}$$

Similar to equations 33 and 34 and as an alternative to the distortion as expressed in equation 53, the correlation could be maximized. Equivalently, the negative correlation could be minimized, since the distortion measure in equation 53 equals $$D_{m'} = \varsigma - 2\tilde{c}_{F,P_{m'}} \cdot c^*_{mag}, 0 \le m' < M_F^{(E_{L_v})}, \qquad \text{eq. 54}$$

where $\varsigma$ is a constant corresponding to the lengths of vectors $\tilde{c}_{F,P_{m'}}$ and $c^*_{mag}$. For normalized vectors $\tilde{c}_{F,P_{m'}}$ and $c^*_{mag}$, $\varsigma$ consequently equals 2. The subsequent processing conditionally depends on whether the selected class-leader root-vector is of category A or B and the distortion $D_{m'}$, determined initially, conditionally requires to be transformed to correspond to the distortion of the class-leader vectors (135). The class-leader root-vector providing the least (transformed) distortion, $D_{m'}^{(t)}$, is selected for the output of the quantization processing (136).

$$m'_Q = \underset{m'=0,1,\ldots,M_{F,u}^{(E_{L_v})}-1}{\operatorname{argmin}} D_{m'}^{(t)}. \qquad \text{eq. 55}$$

Figure 14:
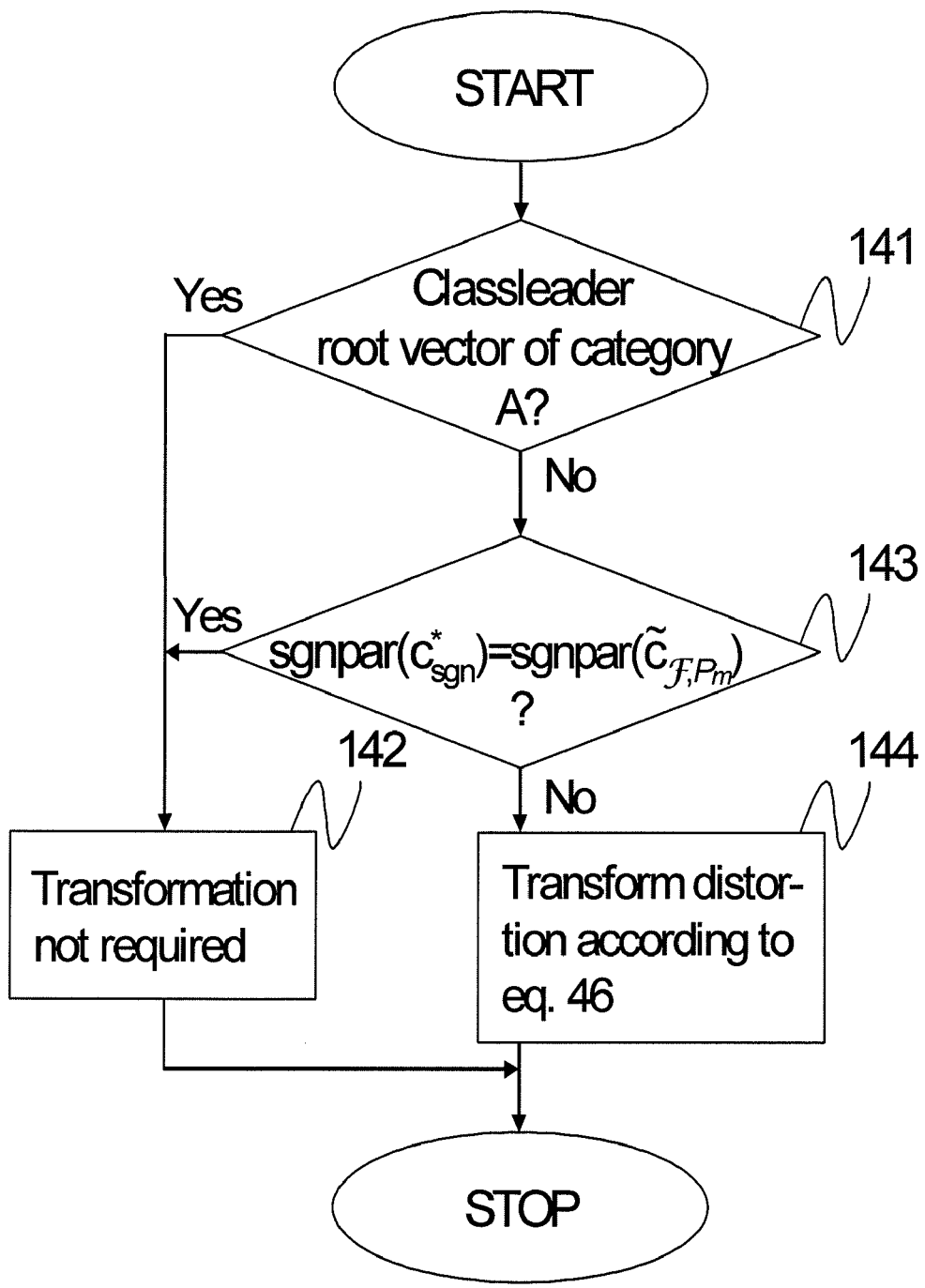
FIG. 14 shows a simplified flowchart for determining a transformed distortion metric according to a preferred embodiment of the invention.

FIG. 14 shows a simplified flowchart for determining a transformed distortion metric. For a class-leader root-vector of category A (141), minimizing the distortion in equation 53 and corresponding to an equivalence class $E_{m'}$, the class-leader vector which achieves the lowest distortion is determined by the sign distribution of the permuted sign vector $c^*_{sgn}$ which is identical to the sign distribution of the class-leader vector. In this case, the distortion is the same for the class-leader vector as for the class-leader root-vector of category A (142). Consequently, transformation of distortion as determined for the class-leader root-vector is not required for vectors of category A (142), $$D_{m'}^{(t)}=D_{m'}, \text{ if category } A, m'=m'_Q. \qquad \text{eq. 56}$$

For a class-leader root-vector $\tilde{c}_{F,P_{m'}}$ of category B, $\tilde{c}_{F,P_{m'}}^{(B)}$, there are two cases to consider depending on sign parity of the permuted sign vector and the class-leader root-vector. In case the sign parities are identical (143), the calculated distortion does not require to be transformed (142), since it is the minimum distortion achievable by all respective class-leader vectors and, consequently, $$D_{m'}^{(t)}=D_{m'}, \text{ if category } B, \text{ case } 1, m'=m'_Q. \qquad \text{eq. 57}$$

For case 1 and for the class-leader root-vector of category B providing the smallest distortion in equation 53, the class-leader vector $\tilde{c}_{F,P_{m'}}^{(B)}$, has identically the same sign distribution as the permuted sign vector $c^*_{sgn}$ (143), as was also the case for category A above.

In case the sign parity of the permuted sign vector $c^*_{sgn}$ differs from sign parity of the class-leader root-vector for a class-leader root-vector $\tilde{c}_{F,P_{m'}}^{(B)}$ of category B, case 2, the sign of a coordinate of the class-leader root-vector differs from $c^*_{sgn}$. Denote this coordinate by $j_0$. The transformed distortion then is $$D_{m'}^{(t)} = D_{m'} - (c^*_{mag,j_0} - \tilde{c}_{F,P_{m'},j_0}^{(B)})^2 + (c^*_{mag,j_0} + \tilde{c}_{F,P_{m'},j_0}^{(B)})^2 \qquad \text{eq. 58}$$
$$= D_{m'} + 4c^*_{mag,j_0} \cdot \tilde{c}_{F,P_{m'},j_0}^{(B)},$$

if category $B$, case 2, $m' = m'_Q$.

The permuted sign vector $c^*_{sgn}$ is corrected accordingly by increasing the permuted sign-vector component in position $j_0$ by 1 (modulo 2), $$c^*_{sgn,j_0} \leftarrow c^*_{sgn,j_0}+1(\text{modulo } 2). \qquad \text{eq. 59}$$

This operation corresponds to an XOR operation $\oplus$ inverting a sign bit in position $j_0$ in a binary representation of $c^*_{sgn}$.

The position $j_0$ is determined from the minimum of the second term in the second equality of equation 58 corresponding to additional distortion, $$j_0 = \underset{0 \le m' < L_v}{\operatorname{argmin}} c^*_{mag,j} \cdot \tilde{c}_{F,P_{m'},j}^{(B)}. \qquad \text{eq. 60}$$

As mentioned above, one or more indices are preferred to the code vector for information transfer on a communications channel. For this purpose, an indexing machine and related processing has been developed beyond previous work of e.g. Pieter and Schalkwijk.

Figure 15:
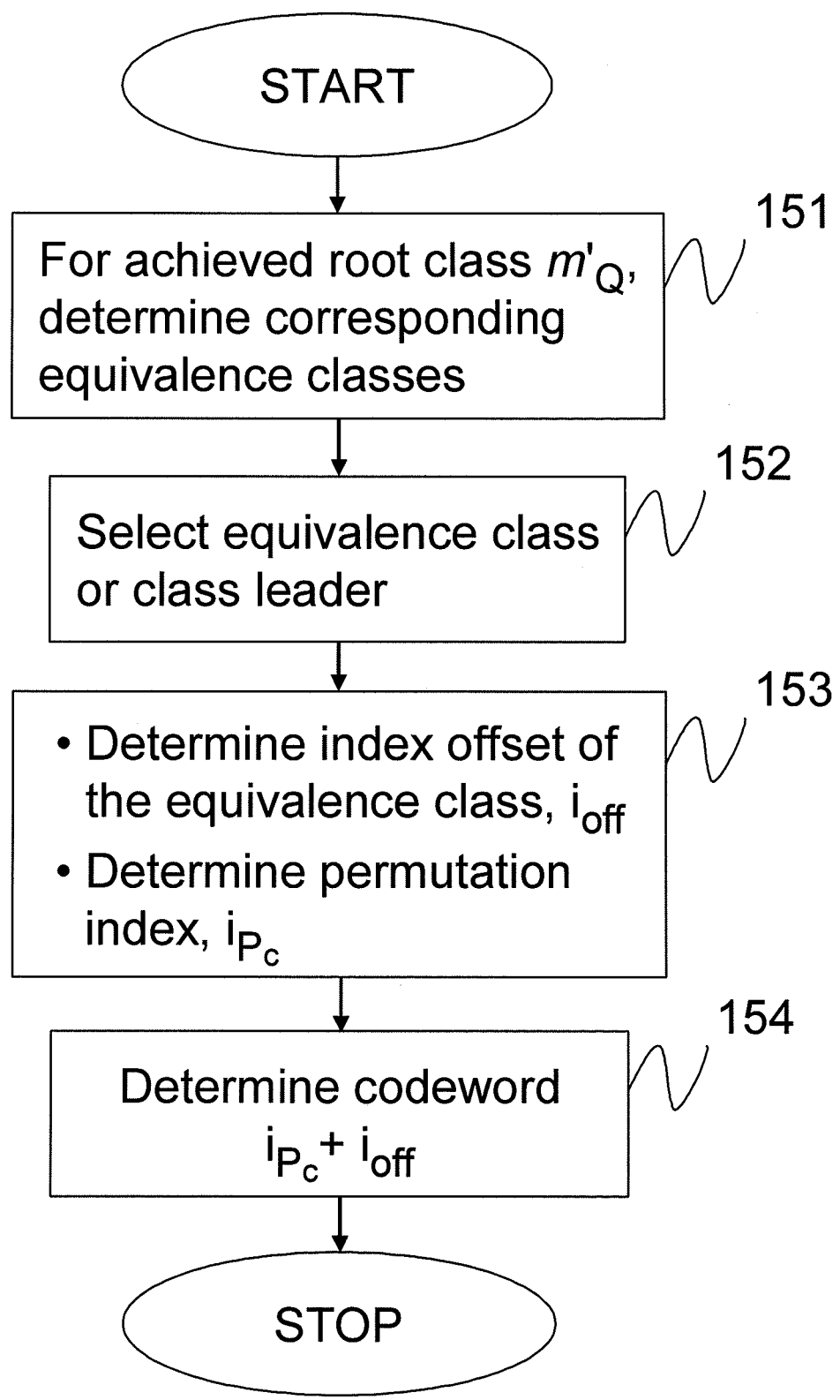
FIG. 15 illustrates schematically indexing providing codewords from quantized data according to an embodiment of the invention.

Provided a permutation matrix P, a permuted sign vector $c^*_{sgn}$ and a root class $F_{m'Q}$, for which equation eq. 55 applies, the indexing is preferably performed as follows and schematically illustrated in the flowchart of FIG. 15 and implemented in processing equipment (191), (194) of FIG. 19.

Determine (151) equivalence classes $E_{m_Q}$ (111-113), (114) corresponding to the selected root class $F_{m'Q}$ (115), (116) as illustrated in example FIG. 11 and table 3.

Based upon the permuted sign vector $c^*_{sgn}$, select (152) the equivalence class $E_{m_Q}$, or equivalently its class leader, from the equivalence classes corresponding to the selected root class as described above in relation to the flowchart of FIG. 13.

Determine (153) index offset $i_{\text{off},E_{m_Q}}$ as illustrated in FIG. 11.

Determine (153) a permutation index $i_{P_c}$ with respect to matrix $P_c$, preferably according to previous work of Pieter and Schalkwijk.

The quantization index codeword is then determined (154) as described in relation to equation 36 on page 26 considering permutation matrix $P_c$, $$i_{Q,sp} = i_{P_c} + i_{\text{off},E_{m_Q}}, \qquad \text{eq. 61}$$

where the permutation matrix $P_c$ of the normalized vector c, output from, e.g., the indexing provided by Pieter and Schalkwijk, replaces P of equation 36. The offset $i_{\text{off},E_{m_Q}}$ is set in relation to the equivalence class of interest $E_{m_Q}$ and is incorporated in the index $i_{Q,sp}$ for communication on the communications channel. In FIG. 11, index range grouping in relation to example root-vector classes is demonstrated. In the example of FIG. 11, root class $F_0$ (115) represents example equivalence classes $E_0$ (111), $E_1$ (112), $E_2$ (113) and example root class $F_1$ (116) corresponds to equivalence class $E_3$ (114). The equivalence class offsets $i_{\text{off},E_0}$ and $i_{\text{off},E_3}$ are also offsets for the root classes $F_0$ and $F_1$, respectively. The equivalence class offsets $i_{off,E_0}, i_{off,E_1}, i_{off,E_2}$ and $i_{off,E_3}$ are preferably stored in read-only memory.

According to one embodiment of the invention, indexing of class-leader vectors is performed on the basis of the sign vector $c^*_{sgn}$ in equation 52. $c^*_{mag}$ in equation 51 is preferably indexed similarly, though $c^*_{mag}$ is not necessarily binary, while $c^*_{sgn}$ is binary. For class leaders in category B, the sign vector $c^*_{sgn}$ with corrected position $j_0$ as in equation 59 is preferably indexed.

Codeword representation by a class-leader root-vector in place of a plurality of class-leader vectors due to the suggested sign separation and parity constraint provides substantial complexity reduction according to preferred embodiments of the invention. Correspondingly, preferred embodiments of the invention provide reduced vector searches, searching an equivalence root class instead of searching a plurality of equivalence classes for a codeword providing least distortion.

The invention identifies the fact that the equivalence classes, E, related to one equivalence root class, F, are based on vector components with the same amplitudes but with different signs. For an equivalence root class, F, one of the equivalence classes need be identified at the decoder to get information on the sign distribution.

The specific equivalence class is preferably determined by index comparison for the equivalence root class, the index range of which corresponds to the index range of one or more equivalence classes as illustrated in FIG. 11.

For an incoming vector quantization index $i_{Q,sp}$, preferably with assistance of stored index offsets $i_{off,mQ}$, the class-leader root-vector that has been identified by the encoder and a corresponding sign distribution index identifying the equivalence class leader are determined. After removal of offset, the resulting index, $i_P$, is input to a decoder, preferably operating in accordance with the suggestions of Schalkwijk and Pieter. From the class-leader root-vector and the sign distribution indicating negative vector components, the relevant information required by the decoder for determining the equivalence class-leader is available.

For all class-leader root-vectors, the weights $w_l$ and the amplitudes $\mu_l$, $0 \leq l < L_P$, are preferably stored without signs. The decoder then modifies/adjusts these values in accordance with the sign adjustments in equation 59 from the sign distribution of the decoded index as received to produce a specific class-leader vector. The weights $w_l$ are adjusted correspondingly. The resulting weights $w_l^{(adj)}$, omitting "(adj)" in the flow chart of FIG. 16 as described below for reasons of simplicity, and amplitudes are preferably included in the decoding according to Schalkwijk and Peter as follows.

Weights and amplitudes appear in pairs $w_l$, $\mu_l$. As earlier described, the index $i_P$ comprises information on the sequential order in which the amplitudes are combined in a vector, referred to as the permutation of the class-leader vector. The sequence $l_c = [l_0\ l_1\ l_2\ \ldots\ l_{L_v-1}]$ in the flow chart in FIG. 16 describes how to arrange the sequences of $w_l^{(adj)}$ and $(1-2c^*_{sgn,l}) \cdot \mu_l$, including also the adjusted signs. Except for the adjusted signs, once the sequence $l_c$ is known, the output code vector $\tilde{x}_{i_Q}$ is determined as $$\tilde{x}_{i_Q} = [\mu_{l_0} \mu_{l_1} \mu_{l_2} \mu_{l_{L_v-1}}]. \qquad \text{eq. 62}$$

Figure 16:
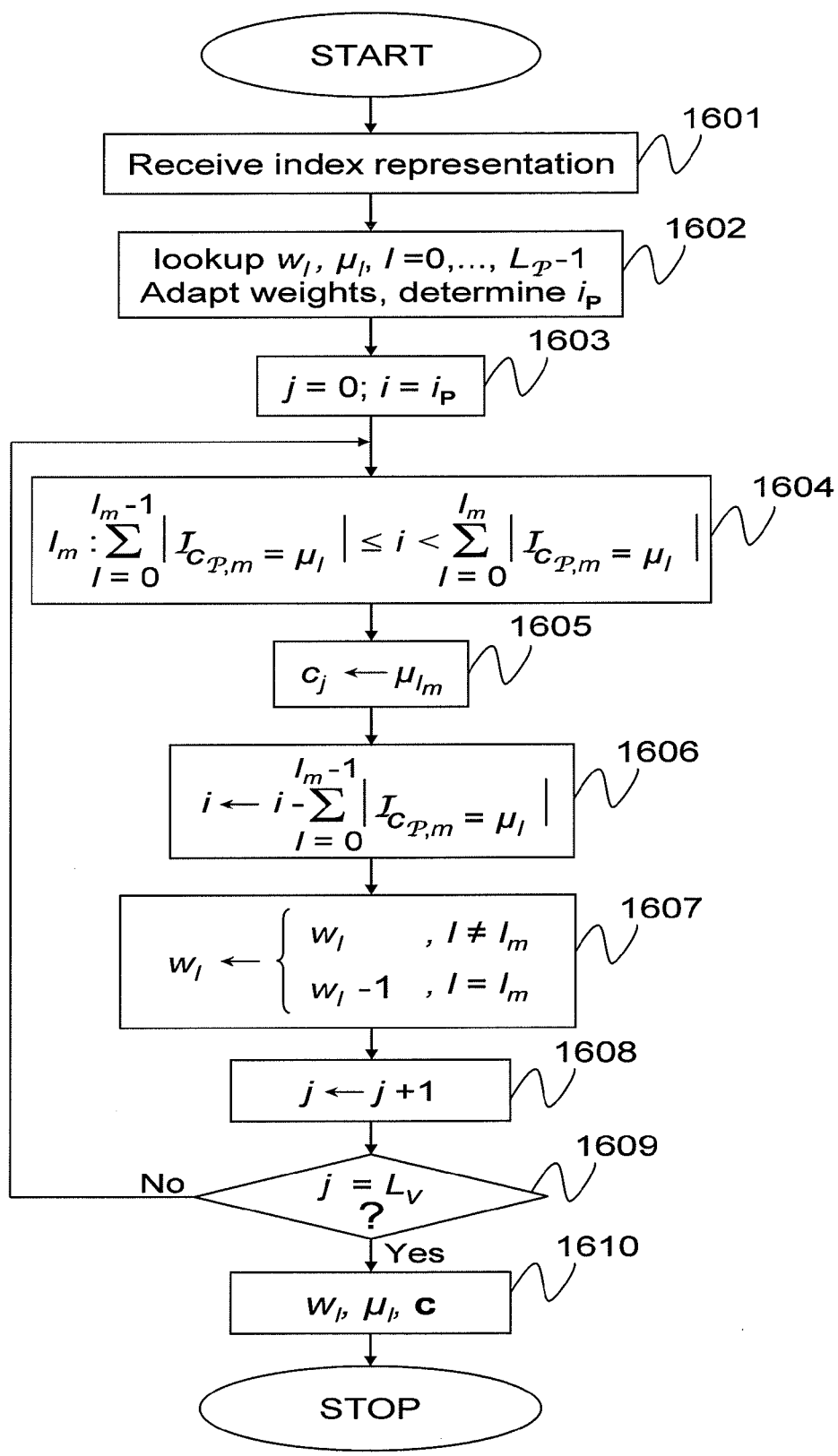
FIG. 16 illustrates schematically a flow-chart of a preferred decoder according to the invention.

FIG. 16 illustrates schematically a flow-chart of an example decoder according to the invention. Index offsets, $i_{off,mQ}$, are stored in the receiver for each equivalence class, c.f. FIG. 11 (111, 112, 113). As illustrated in FIG. 11, some of the offsets are also index offsets of a particular root class (115, 116). Also, a particular offset for a root class (115) corresponds to an equivalence class and sign distribution (111, 112, 113). The stored offsets of root classes (115, 116) identify a particular root class (115, 116) from a received index. The stored offsets identify a particular equivalence class, which corresponds to a particular sign distribution. The identified equivalence class is transformed into a sign distribution. The weights are adapted to this sign distribution (1602) and the index offset is preferably subtracted from the received index (1601) to form a residual index, $i_P$, (1602) for processing according to the principles of Schalkwijk and Pieter.

After initialization (1603), initiating values, $\mu_l$, and weights, $w_l$, for $l \in [0, L_P-1]$ to pre-stored values of the class-leader root-vector corresponding to the offset or index range, a range is determined (1604), such that for some $m \in [0, L_v-1]$ there is an $l_m$ fulfilling $$\sum_{l=0}^{l_m-1} |I_{c_{P,m}=\mu_l}| \leq i < \sum_{l=0}^{l_m} |I_{c_{P,m}=\mu_l}|, \qquad \text{eq. 63}$$

where $I_{c_{P,m}\mu_l}$ is an index sub-range of equation 38, omitting the $\sim$ in $\tilde{c}_{P,m}$ to simplify typography. The quantized code vector component is allotted (1605) its magnitude corresponding to the determined range and the index is updated by subtracting (1606) the amount determined earlier (1604) and updating the weights (1607). The recursion proceeds similarly for the next component (1608) until all vector components are determined (1609) and the magnitudes and weights, and consequently the code vector, results (1610).

The encoder and decoder preferably store weights, $w_l$, amplitudes, $\mu_l$, a mode or category flag, M, indicating category A or B for each of the class-leader root-vectors of the code. Also, a sign-parity flag, sgnpar($\tilde{c}$), indicating odd or even parity of the binary sign vector $c^*_{sgn}$ is preferably stored at least for class-leader root-vectors of category B.

A distribution of signs $\sigma_1$ indicating number of negative signs to transform a class-leader root into a class-leader vector is transferred from the encoder to the decoder over the communications channel as need be.

As a non-exclusive example, consider a class-leader root-vector of a single non-zero amplitude 2 of weight 3 with one negative sign, for a vector of length 5. For a class-leader root-vector of [2 2 2 0 0], the class-leader vector is then [2 2 0 0 −2], remembering that class-leader vectors have their components sorted in decreasing order, c.f. equation 7.

For another example, consider a weight distribution of $w_0 = 3$, $w_1 = 2$ and a sign distribution of $\sigma_0, \sigma_1$. Considering the three positions corresponding to $w_0 = 3$, there are 4 possible sign distributions of these positions

| $\sigma_0$ | +/− |
|---|---|
| 0 | + + + |
| 1 | + + − |
| 2 | + − − |
| 3 | − − − |

Considering the two positions corresponding to $w_1=2$, there are three possible sign distributions

| $\sigma_1$ | +/− |
|---|---|
| 0 | + + |
| 1 | + − |
| 2 | − − |

Considering all five positions, there are consequently 12 different sign distributions possible. The index subspace could then be subdivided in relation to, e.g., $w_1$, such that an index offset of an integer multiple of three corresponds to a different sign distribution of the $w_0$ positions.

| $\sigma_0, \sigma_1$ | | | | | | | | | | | |
|---|---|---|---|---|---|---|---|---|---|---|---|
| 0,0 | 0,1 | 0,2 | 1,0 | 1,1 | 1,2 | 2,0 | 2,1 | 2,2 | 3,0 | 3,1 | 3,2 |
| index 0 | 1 | 2 | 3 | 4 | 5 | 6 | 7 | 8 | 9 | 10 | 11 |

Of course, this is a simplified example for purpose of illustration. For most codes, there are more than two different weights. The index processing preferably subdivides the index (sub-)space for each additional weight under consideration.

For category A vectors, a particular value on a particular position of the sign distribution, e.g. $\theta_o$, does not precondition a restricted number of possible sign distributions considering the remaining positions, since all sign distributions are possible for category A. For the simplified example above, all 12 sign distributions are possible for vectors of category A.

For vectors of category B, however, also the sign-parity constraint need be considered. Consider again the simplified example above. The value of $\sigma_0$ provides a sign-parity contribution of $\sigma_0$ (modulo 2). E.g., in case of a sign-parity contribution of $\pi_0$ of the corresponding positions of the class-leader root vector, the sign-parity constraint for the subsequent positions corresponding to weight $w_1$ in the simplified example will restrict the index sub-grouping in relation to the subsequent positions such that, for the simplified example, the index sub-grouping is preferably restricted to subsets fulfilling $\pi_1 = \pi_0 + \sigma_0$ (modulo 2). Consequently, for the simplified example of twelve indices above, indices 0-2 and 6-8 are considered in case the first $w_0=3$ positions of the class-leader root vector is of even sign parity, and indices 3-5 and 9-11 are considered in case the first $w_0=3$ positions of the class-leader root vector are of odd sign parity.

In analogy with the simplified example, a preferred indexing of code vectors of category A and B, respectively, is described in more detail below.

As explained above, encoder and decoder preferably store weights, $w_l$, and amplitudes, $\mu_l$, $0 \leq l < N_F$ for class-leader root vectors of a root equivalence class F with $N_F$ weights for non-zero component amplitudes, $\mu_l$. Preferably, the weights and amplitudes are stored in read-only memory, ROM. Other non-limiting example storage media for the weights and amplitudes are random access memory, RAM, or magnetic or electro-magnetic storage devices for reading of amplitudes and weights into RAM, e.g. at startup. Of course, they may be communicated over the communications channel at the expense of an increased load on the communications channel.

In the encoder the stored weights and amplitudes are combined with a sign distribution $\sigma_l$, where $0 \leq \sigma_l \leq w_l$, $0 \leq l \leq N_F$, to provide an index $I_E$ from which the decoder is capable of reconstructing the quantized vector. In effect, the decoder can be made to reconstruct the class-leader vector and the equivalence class from the index and pre-stored data.

To simplify notion, a helping function $N_E^{(A)}(\{w_l\}_{l=m}^{n})$ is defined for vectors of category A, $$N_E^{(A)}(\{w_l\}_{l=m}^{n}) = \prod_{l=m}^{n}(w_l+1), \quad \text{eq. 64}$$

where $0 \leq N_E^{(A)}(\{w_l\}_{l=0}^{N_F-1}) < I_E$, and where m and n are integers, n>m.

A corresponding helping function, $N_E^{(B)}(\{w_l\}_{l=m}^{n}; \pi)$, is preferably defined for vectors of category B, where $\pi$ denotes a sign-parity constraint and $\{w_l\}_{l=m}^{n}$ is the weight distribution as for vectors of category A.

$$N_E^{(B)}(\{w_l\}_{l=m}^{n}; \pi) = \begin{cases} \dfrac{N_E^{(A)}(\{w_l\}_{l=m}^{n})}{2} & \text{if } N_E^{(A)}(\{w_l\}_{l=m}^{n}) \text{ even} \\ \dfrac{N_E^{(A)}(\{w_l\}_{l=m}^{n})+1}{2} & \text{if } N_E^{(A)}(\{w_l\}_{l=m}^{n}) \text{ odd,} \\ & \pi \text{ even} \\ \dfrac{N_E^{(A)}(\{w_l\}_{l=m}^{n})-1}{2} & \text{if } N_E^{(A)}(\{w_l\}_{l=m}^{n}) \text{ odd,} \\ & \pi \text{ odd,} \end{cases} \quad \text{eq. 65}$$

where $N_E^{(A)}(\{w_l\}_{l=0}^{N_F-1})$, $N_E^{(B)}(\{w_l\}_{l=0}^{N_F-1}; \pi) < I_E$.

The helping functions, $N_E^{(A)}(\{w_l\}_{l=0}^{N_F-1})$, $N_E^{(B)}(\{w_l\}_{l=0}^{N_F-1}; \pi)$, correspond to the size of the index space for sign permutations. For category B vectors, it corresponds to the size of the index space for sign permutations given the sign-parity constraint $\pi$ for the class-leader root-vector. The helping function also corresponds to the number of class-leader vectors and equivalence classes that can be produced from the current class-leader root-vector, for category B preconditioned on the sign-parity constraint.

Figure 17:
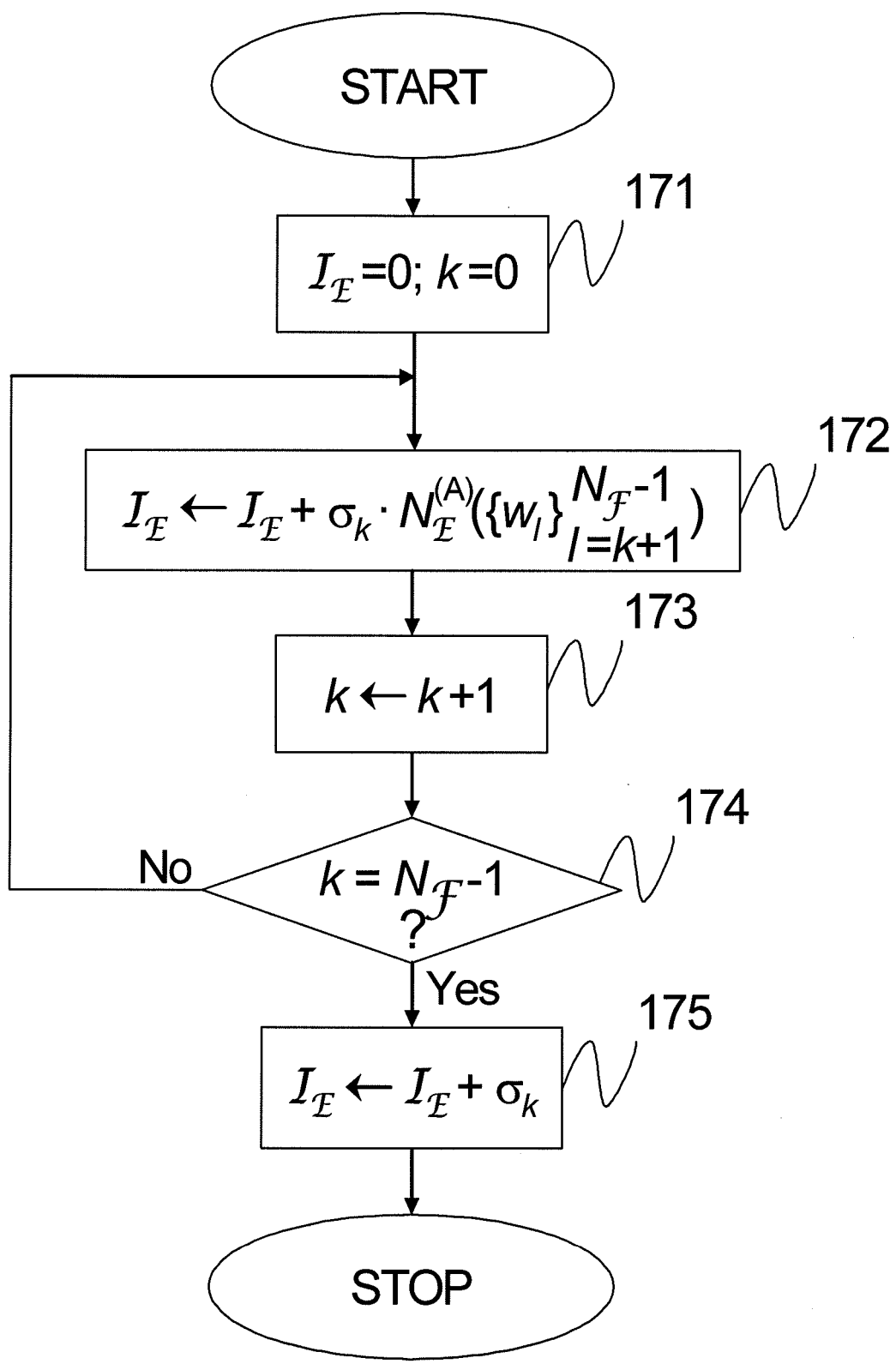
FIG. 17 displays schematically preferred index processing of code vectors of category A according to the invention.

The preferred index processing of code vectors of category A, forming an example component (142) of FIG. 14 and adopting the principles of FIG. 12, is schematically illustrated in FIG. 17. The target index, $I_E$, and an iteration counter, k, are initialized (171) and the weights $w_l$ preferably loaded into operational memory of a processing entity. For each iteration, the index is updated (172, 175). Preconditioned on the iteration number, k, it is incremented by $\sigma_k \cdot N_E^{(A)}(\{w_l\}_{i=k+1}^{N_F-1})$ (172) or $\sigma_k$ (175), where $N_F$ is the number of weights of non-zero component amplitudes, $\mu_l$, for the class-leader root-vector.

An example for non-zero weight distribution $w_0=1$, $w_1=3$, $w_2=3$, and sign distribution $\sigma_0=1$, $\sigma_1=0$, $\sigma_2=1$ illustrates the processing of FIG. 17 for target class-leader vector $[\mu_1\ \mu_1\ \mu_1\ \mu_2\ \mu_2\ -\mu_2\ -\mu_0]$. According to the helping function, there are $N_E^{(A)}(1, 3, 3) = 32$ equivalence classes related to the class-leader root vector of this example. After the first iteration, the candidate for index $I_E$ is determined to 16. The second iteration does not change the candidate index since $\sigma_1 = 0$. After the third iteration, the index is finally determined to 17 from the previous candidate index and $\sigma_2 = 1$.

Figure 18:
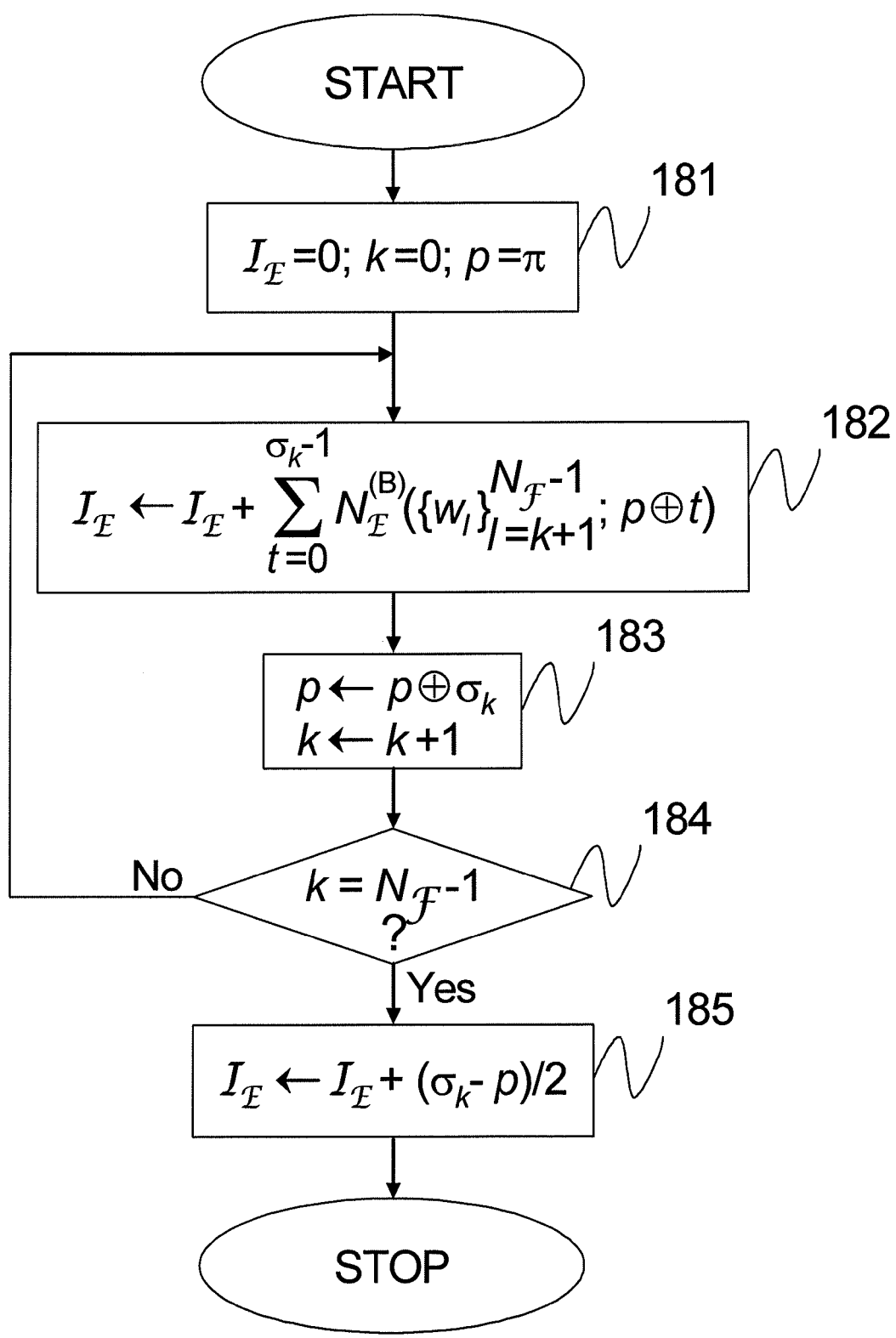
FIG. 18 illustrates schematically preferred index processing of code vectors of category B according to the invention.

The preferred index processing of code vectors of category B, forming an example component (144) of FIG. 14 and adopting the principles of FIG. 12, is illustrated schematically in FIG. 18. The mode flag is set to M=1 to indicate category B (M=0 for category A). The target index, $I_E$, and an iteration counter, k, are initialized (181) and the weights $w_1$ preferably loaded into operational memory of a processing entity. A parity flag is initialized (181) to the preferably pre-stored sign-parity π of the class-leader root-vector corresponding to the class-leader vector of the equivalence class. For each iteration the candidate for index $I_E$ is updated (182, 185). For all but the last iteration, the candidate index is updated by a sum of index (sub-)space sizes $N_E^{(B)}(\{w_1\}_{1=k+1}^{N_F-1}; p^*)$, where p* is adjusted candidate parity, adjusted for the parity of the various sign combinations corresponding to the various weights as illustrated above for the simplified example. As before, $N_F$ is the number of weights for non-zero component amplitudes, $\mu^1$. The adjustment is expressed in FIG. 18 as a summation modulo 2, indicated (182) by ⊕ for brevity even though t is not necessarily binary. For each iteration, the candidate parity is updated in relation to the sign distribution and the next weight and sign combinations are considered (183) until all but one non-zero weight(s) have been considered (184). Again, ⊕ denotes (183) a modulo-2 sum. For the last update of the candidate parity it is preferably verified that $\sigma_{N_F-1}-p$ is even, and an integer representing half of this amount increments the candidate index to form the final index for category B (185).

Figure 19:
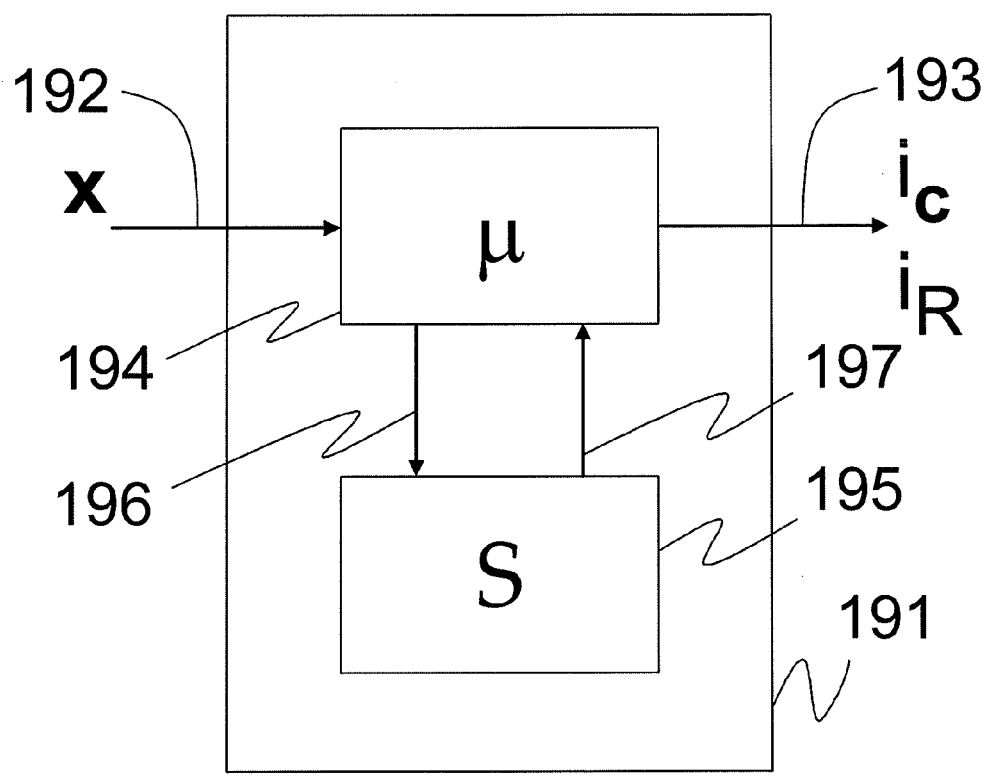
FIG. 19 monitors a simplified block diagram of example equipment according to the invention.

FIG. 19 illustrates a block diagram of example equipment (191) according to the invention. The equipment comprises an input (192) for inputting signals to be quantized or indexed, for which a block of data is represented by a vector x, and an output (193) providing signal codewords. According to different modes of the embodiment, the output signal carries codewords or indices corresponding to input vector x, or a normalized vector of radius 1 and a radius. In case indexing is not included in processing circuitry (194), a signal carrying code vectors is output (192) in one mode of operating an embodiment of the invention. For efficient encoding and decoding, the equivalence class offsets $i_{\text{off},E_{\pi_0}}$ are preferably stored in read only memory, ROM, flash memory or other storage medium (195). Processing circuitry (194) of the equipment (191) implements quantization as described above. Preferably, the processing circuitry implements indexing. Class-leader root-vectors are preferably stored in memory or other storage medium (195) to improve decoding speed or reduce amount of communicated data, and the processing circuitry (194) accesses (196) the storage medium (195) and reads memory or storage content (197). The processing circuitry also preferably accesses some random access memory, RAM, (194), (195) for its operations.

While the invention has been described in connection with specific embodiments thereof, it will be understood that it is capable of further modifications. This application is intended to cover any variations, uses, adaptations or implementations of the invention, not excluding software enabled units and devices, within the scope of subsequent claims following, in general, the principles of the invention as would be obvious to a person skilled in the art to which the invention pertains.

The invention claimed is:

1. A method of representing signal samples with quantized samples for communication over a communications channel characterized in that comprising:
   quantizing, using a processor, the signal samples to signals corresponding to points of an E-lattice, wherein each quantized signal has a class-leader root-vector representative as determined including a sign distribution, a quantized signal being identified by the class-leader root vector representative and the sign distribution,
   wherein the sign distribution is communicated over a communications channel;
   wherein the quantization is minimizing a distortion criterion as determined from class-leader root-vectors of the E-lattice;
   wherein the minimum is transformed as need be to form a minimum over the set of class leaders; and
   wherein the distortion as determined from class-leader root-vectors of the E-lattice is conditionally transformed depending on a sign distribution of components of a vector representation of a signal sample to be quantized.

2. The method according to claim 1, comprising a conditional sign-parity update.

3. The method according to claim 2, wherein the signal sample representation includes inversion of a sign bit when sign parity of a signal sample and sign parity of a class-leader root-vector differ.

4. The method according to claim 1, wherein each signal sample is represented by a vector, for which each component comprises a magnitude and a sign bit and distortion determined from the one or more class-leader root-vectors is transformed when the sign parity of the vector representation differs from the sign parity of the class-leader root-vector.

5. The method according to claim 4, wherein the determined distortion is additively increased proportional to a product of the magnitude of the signal sample representation and a class-leader root-vector selected for providing minimum transformed distortion for a component for which the sign bits of an ordered signal sample and the class-leader root-vector differ.

6. The method according to claim 4, wherein an index is determined for a vector comprising the magnitude components.

7. The method according to claim 1, wherein the cardinality of a set of said class-leader root-vectors of the E-lattice is smaller than the cardinality of a set of class leaders for said points of the E-lattice.

8. The method according to claim 1, wherein the distortion criterion comprises squared Euclidean distance.

9. The method according to claim 1, wherein an index is determined representing a vector comprising the sign distribution.

10. The method according to claim 9, wherein the index is determined for an adjusted vector, wherein a vector component has been adjusted corresponding to a sign inversion.

11. The method according to claim 1, wherein the quantized samples are communicated over the communications channel by means of offset codewords determined by, for each codeword, offsetting an index achieved for a sequentially ordering of components of a data block of magnitudes according to size, and wherein the offset represents a particular equivalence class corresponding to the root class representative of the quantized signal.

12. The method according to claim 1, wherein the E-lattice fulfills the requirement $$E_{L_v} = D_{L_v} \cup (D_{L_v} + v) : v = [½ \ldots ½],$$

where $$D_{L_v}: y \in \left\{ [y_0 y_1 \ldots y_{L_v-1}] : y_j \in \mathbb{Z}, \sum_{j=0}^{L_v-1} y_j \equiv 0 (\text{modulo } 2) \right\}$$

is the checkerboard lattice, or D-lattice, of the same number of dimensions, $L_v$, as the E-lattice for integers $\mathbb{Z}$.

* * * * *